United States Patent
Komura et al.

(10) Patent No.: US 12,240,074 B2
(45) Date of Patent: Mar. 4, 2025

(54) POLISHING HEAD, AND POLISHING TREATMENT DEVICE

(71) Applicant: MICRO ENGINEERING, INC., Tokyo (JP)

(72) Inventors: Akio Komura, Osaka (JP); Takafumi Kuwano, Tokyo (JP); Hajime Tomizawa, Tokyo (JP)

(73) Assignee: MICRO ENGINEERING, INC., Tokyo (JP)

( * ) Notice: Subject to any disclaimer, the term of this patent is extended or adjusted under 35 U.S.C. 154(b) by 0 days.

(21) Appl. No.: 18/550,884

(22) PCT Filed: Mar. 14, 2022

(86) PCT No.: PCT/JP2022/011298
§ 371 (c)(1),
(2) Date: Sep. 15, 2023

(87) PCT Pub. No.: WO2022/196631
PCT Pub. Date: Sep. 22, 2022

(65) Prior Publication Data
US 2024/0082983 A1    Mar. 14, 2024

(30) Foreign Application Priority Data
Mar. 17, 2021    (JP) .................. 2021-043860

(51) Int. Cl.
*B24B 37/20* (2012.01)
*B24B 37/32* (2012.01)

(52) U.S. Cl.
CPC .............. *B24B 37/20* (2013.01); *B24B 37/32* (2013.01)

(58) Field of Classification Search
CPC ............................................. B24B 37/27–32
See application file for complete search history.

(56) References Cited

U.S. PATENT DOCUMENTS

| | | | | |
|---|---|---|---|---|
| 5,795,215 | A | * | 8/1998 | Guthrie .................. B24B 37/32 451/286 |
| 6,623,343 | B2 | * | 9/2003 | Kajiwara ................ B24B 37/30 451/36 |

(Continued)

FOREIGN PATENT DOCUMENTS

| CN | 203092329 U | 7/2013 |
|---|---|---|
| CN | 107953242 A | 4/2018 |

(Continued)

OTHER PUBLICATIONS

Machine translation of JP 2016165792 to Komura "Komura Translation" (Year: 2016).*

(Continued)

*Primary Examiner* — Joel D Crandall
*Assistant Examiner* — Jonathan R Zaworski
(74) *Attorney, Agent, or Firm* — HAUPTMAN HAM, LLP

(57) ABSTRACT

A polishing head includes a head housing having a first flange part that extends outward from an upper position of a circumferential surface of a cylindrical body and a second flange part that extends outward from a lower position of the circumferential surface, a membrane support ring that is sized to surround an outer circumference of the second flange part and has a third flange part that is formed at an upper end part thereof and located between the first flange part and the second flange part, a membrane that covers a lower end-side opening part of the membrane support ring and holds the wafer with a backing film pasted to a front surface thereof interposed therebetween, a retainer ring formed in a shape to surround an outer circumference of the substrate, and driving means that integrally horizontally rotates the head housing, the membrane support ring, and the retainer ring.

9 Claims, 19 Drawing Sheets

(56) References Cited

U.S. PATENT DOCUMENTS

| | | | |
|---|---|---|---|
| 6,769,973 B2* | 8/2004 | Boo | B24B 41/061 451/41 |
| 6,923,714 B1* | 8/2005 | Zuniga | B24B 37/30 451/388 |
| 7,033,252 B2* | 4/2006 | Fuhriman | B24B 37/30 451/41 |
| 7,507,148 B2* | 3/2009 | Kitahashi | B24B 37/30 451/286 |
| 2022/0281064 A1* | 9/2022 | Zuniga | B24B 37/30 |

FOREIGN PATENT DOCUMENTS

| | | | |
|---|---|---|---|
| CN | 108369903 A | | 8/2018 |
| CN | 112292750 A | | 1/2021 |
| JP | 2002-187060 A | | 7/2002 |
| JP | 2003-311607 A | | 11/2003 |
| JP | 2003533359 A | | 11/2003 |
| JP | 2004034217 A | | 2/2004 |
| JP | 2012056011 A | | 3/2012 |
| JP | 5210444 B1 | | 6/2013 |
| JP | 2016-78159 A | | 5/2016 |
| JP | 2016-174159 A | | 9/2016 |
| JP | 2016165792 A | * | 9/2016 |
| JP | 2017-64894 A | | 4/2017 |
| JP | 2018-167926 A | | 11/2018 |
| JP | 2018-171670 A | | 11/2018 |
| JP | 2019121650 A | | 7/2019 |
| KR | 1020000048476 A | | 7/2000 |
| KR | 1020020028845 A | | 4/2002 |
| KR | 1020070057867 A | | 6/2007 |
| KR | 1020080100841 A | | 11/2008 |
| KR | 1020190064783 A | | 6/2019 |
| TW | I676525 B | | 11/2019 |
| WO | 2006038259 A1 | | 4/2006 |

OTHER PUBLICATIONS

International Search Report issued in corresponding International Application No. PCT/JP2002/011298, dated May 24, 2022, pp. 1-5, Japan Patent Office, Tokyo, Japan.

Korean Notice Of Decision Of Granting Patent issued in corresponding Korean Application No. 2024008070119, dated Jan. 24, 2024, pp. 1-3.

Chinese Office Action issued in corresponding Chinese Application No. 202280021212.0, dated Mar. 13, 2024, pp. 1-6.

Taiwanese Office Action issued in corresponding Taiwanese Application No. 111109420, dated Feb. 7, 2024, pp. 1-5.

* cited by examiner

POLISHING HEAD, AND POLISHING TREATMENT DEVICE

The present application is a U.S. National Phase of International Application Number PCT/JP2022/011298, filed Mar. 14, 2022, which claims priority to Japanese Application No. 2021-043860, filed Mar. 17, 2021.

TECHNICAL FIELD

The present invention relates to a polishing head and a polishing treatment device used for polishing treatment of a substrate, such as a semiconductor wafer or a glass substrate.

BACKGROUND ART

In recent years, the integration of substrates (referred to as wafers hereinafter), such as semiconductor wafers or glass substrates, is increasing, and the planarization technique for substrate surfaces is becoming increasingly important in the semiconductor device manufacturing process. The most important planarization technique is the chemical mechanical polishing (CMP). The chemical mechanical polishing involves using a polishing treatment device (referred to also as a polishing device) and performing polishing treatment by bringing a substrate into sliding contact with a polishing surface, such as a polishing pad, while supplying a polishing liquid containing abrasive grain such as silica ($SiO_2$) onto the polishing surface.

The polishing head that holds the wafer is provided with a retainer ring formed in a ring shape that surrounds the outer circumference of the wafer to prevent the wafer energized by the sliding frictional force caused by the rotation in the polishing treatment from flying to the outside. The retainer ring prevents the flying out of the wafer during polishing by receiving the wafer at the inner circumference thereof.

A set of components including the retainer ring can be available as a template, in order to facilitate attachment to and detachment from the polishing head.

For example, the CMP device disclosed in Patent Literature 1 prevents the pressing force of the backing film to press the circumferential edge of the wafer from being excessively high even if the template wears out and the template thickness gradually decreases. According to the patent literature, even if the template thickness changes with time, the polishing rate at the circumferential edge of the wafer can be prevented from varying more significantly than the polishing rate at the other regions of the wafer.

The polishing machine disclosed in Patent Literature 2 effectively is used for polishing of a rectangular polished material and prevents insufficient polishing of corner parts of the rectangular polished material by exerting an even pressing force to the corner parts of the polished material.

The polishing head disclosed in Patent Literature 3 has a plurality of pressure chambers and prevents stress concentration at the wafer edge by applying a pressing force from each pressure chamber to the back side of a substrate according to the amount of the pressure fluid in the pressure chamber, thereby applying a desired pressing force over the entire surface of the treated surface of the substrate in a seamless manner, and includes a backing film having an outer diameter smaller than the outer diameter of the wafer. Thus, according to the patent literature, uneven polishing, insufficient polishing, or over-polishing due to an uneven pressing force can be prevented, the deterioration of the edge side front least square range (ESFQR) can be substantially reduced, and a high-quality production technique can be provided.

CITATION LIST

Patent Literature

Patent Literature 1: Japanese Patent Publication 2019-121650
Patent Literature 2: Japanese Patent Publication 2004-034217
Patent Literature 3: Japanese Patent Publication 2014-018933

SUMMARY OF INVENTION

Technical Problem

With such a polishing treatment device, uneven polishing, such as insufficient polishing or over-polishing, occurs if the relative speed of a surface of a wafer to be polished (referred to as a "polished surface", hereinafter) and a polishing pad and the pressing force are not even over the entire polished surface. In the following, insufficient or excessive may be mentioned as under or over.

For example, as evaluation indices (flatness evaluation indices) for evaluating the flatness of a vicinity of a wafer edge, roll off amount (ROA, referred to also as roll off amount or edge roll off amount) and ESFQR are used. ROA and ESFQR are parameters indicating the outer circumferential region precision of the wafer.

In recent years, wafers having a flat outer circumferential region are required, and there is a demand for a polishing treatment device capable of performing a polishing treatment with high flatness, such as 10 [nm] or less in terms of these flatness evaluation indices.

The retainer ring of the template wears out and decreases in thickness as the number of wafers produced increases. Here, the effect of the gradual decrease of the template thickness or, more specifically, the wearing out of the retainer ring on the polishing precision will be described.

FIG. 14 are diagrams for illustrating a model of the removal rate RR with a conventional template under a certain processing condition. The horizontal axis indicates the wafer radius r, and the vertical axis indicates the removal rate RR. In FIG. 14(a), the wafer thickness Wt=770 [μm], and the retainer ring thickness RRt=820 [μm]. In FIG. 14(b), Wt=770 [μm], and RRt=770 [μm]. In FIG. 14(c), Wt=770 [μm], and RRt=720 [μm].

FIG. 14(a) shows an ideal shape, and the behavior and effect (the pressurized area diameter<the wafer diameter) in FIG. 16 described later are observed. FIG. 14(b) agrees with the FEM analysis theory. However, in FIG. 14(c), the wafer edge is pressed by the vertical component force of the tension of the membrane, and ESFQR is significantly worse than the theoretical tendency.

FIG. 15 are diagrams for illustrating a removal rate RR model with templates that provide a pressurized area diameter<a wafer diameter according to Patent Literatures 1 and 3.

In FIG. 15(a), ESFQR is substantially improved compared with the case where the entire surface of the wafer is pressed shown in FIG. 14(b). However, in FIG. 15(b), the retainer ring has worn out, and the wafer edge is pressurized while being pressed by the vertical component force of the tension of the membrane, so that ESFQR is slightly worse than that in FIG. 15(a).

As shown in FIGS. 15, with the conventional templates, as the retainer ring wears out, the removal rate RR substantially varies. Therefore, there is a problem that the precision specifications of the current polishing treatment are hard to meet.

With the template according to Patent Literature 1 shown in FIGS. 15, in the precision specifications of the current polishing treatment, the removal rate RR is required to be further stabilized from the mass production aspect.

With the polishing head disclosed in Patent Literature 3, in the polishing treatment, variations of the flatness (ESFQR) of wafers are observed as the processing time increases.

A major object of the present invention is to provide a polishing head and a polishing treatment device that can prevent uneven polishing, such as partial insufficient polishing or over-polishing, of a polished surface of a substrate, further improve ESFQR or the like of the substrate surface, and steadily perform a polishing treatment of a large number of substrates with high quality.

Solution to Problem

The present invention provides a polishing treatment device, including: a polishing table having a polishing pad; and a polishing head that holds a substrate to be polished and brings a polished surface of the substrate into sliding contact with the polishing pad, wherein the polishing head includes: a head housing that has a first flange part that extends outward from an upper position of a circumferential surface of a cylindrical body and a second flange part that extends outward from a lower position of the circumferential surface; an annular body that is sized to surround an outer circumference of the second flange part and has a third flange part that is formed at an upper end part thereof and located between the first flange part and the second flange part; an elastic body that covers a lower end-side opening part of the annular body and holds the substrate with a backing film pasted to a front surface thereof interposed therebetween; a retainer ring formed in a shape to surround an outer circumference of the substrate; and driving means that integrally horizontally rotates the head housing, the annular body, and the retainer ring, an annular elastic body is arranged on a back surface of the elastic body, and a corrective pressing ring that applies a pressure to an upper surface of the annular elastic body is arranged inside the annular body, and the polishing head includes: first pressure adjusting means that adjusts a processing pressure applied to a back side of the substrate opposite to the polished surface by adjusting a pressure in a space surrounded by the head housing, the annular body, and the elastic body; second pressure adjusting means that adjusts a pressure applied to the polishing pad by the retainer ring by means of the first flange part; third pressure adjusting means that adjusts, by means of the second flange, a processing pressure applied to a back-side circumference of the substrate opposite to the polished surface by raising or lowering the annular body via the third flange part; fourth pressure adjusting means that adjusts, by means of the second flange, a compensating pressure applied to a back-side outer circumference vicinity of the substrate opposite to the polished surface by the corrective pressing ring via the annular elastic body; and controlling means that controls operations of the driving means and the first, second, third, and fourth pressure adjusting means.

A polishing head according to the present invention is a polishing head provided in a polishing treatment device having a polishing pad that rotates horizontally, including: a head housing that has a first flange part that extends outward from an upper position of a circumferential surface of a cylindrical body and a second flange part that extends outward from a lower position of the circumferential surface; an annular body that is sized to surround an outer circumference of the second flange part and has a third flange part that is formed at an upper end part thereof and located between the first flange part and the second flange part; an elastic body that covers a lower end-side opening part of the annular body and holds the substrate with a backing film pasted to a front surface thereof interposed therebetween; a retainer ring formed in a shape to surround an outer circumference of the substrate; and driving means that integrally horizontally rotates the head housing, the annular body, and the retainer ring, an annular elastic body being arranged on a back surface of the elastic body, and a corrective pressing ring that applies a pressure to an upper surface of the annular elastic body being arranged inside the annular body, and the polishing head including: first pressure adjusting means that adjusts a processing pressure applied to a back side of the substrate opposite to the polished surface by adjusting a pressure in a space surrounded by the head housing, the annular body, and the elastic body; second pressure adjusting means that adjusts a pressure applied to the polishing pad by the retainer ring by means of the first flange part; third pressure adjusting means that adjusts, by means of the second flange, a pressurized area in which the processing pressure is applied to a back-side circumference of the substrate opposite to the polished surface by raising or lowering the annular body via the third flange part; fourth pressure adjusting means that adjusts, by means of the second flange, a compensating pressure applied to a back-side outer circumference vicinity of the substrate opposite to the polished surface by the corrective pressing ring via the annular elastic body; and controlling means that controls operations of the driving means and the first, second, third, and fourth pressure adjusting means.

A polishing treatment method performed by a polishing head provided in a polishing treatment device having a polishing pad that rotates horizontally includes: a first step performed by first pressure adjusting means applying a processing pressure to a back side of a substrate opposite to a polished surface, second pressure adjusting means applying a pressure to the polishing pad, and third pressure adjusting means raising an annular body to reduce a processing pressure on a back-side circumference of the substrate opposite to the polished surface compared with the processing pressure applied by the first pressure adjusting means; and a second step performed by the first pressure adjusting means stopping applying the processing pressure, the second pressure adjusting means applying the pressure to the polishing pad, the third pressure adjusting means lowering the annular body to stop reducing the processing pressure on the back-side circumference of the substrate opposite to the polished surface, and fourth pressure adjusting means applying a compensating pressure to a back-side outer circumference vicinity of the substrate opposite to the polished surface.

Advantageous Effects of Invention

According to the present invention, a polishing head and a polishing treatment device can be provided that can prevent uneven polishing, such as partial insufficient polishing or over-polishing, of a polished surface of a substrate, improve ESFQR or the like of the substrate surface, and steadily perform a polishing treatment of a large number of substrates with high quality.

DESCRIPTION OF EMBODIMENTS

Now, basic concepts of the present invention will be described with reference to FIG. 16.

With a conventional polishing head mechanism, a processing pressure that is uniform or stepwise in the radial direction is applied to the entire area (from the center to the outer circumferential edge) of a wafer. In particular, the pressurization at the outer circumferential edge part has a significant effect on ESFQR. For example, in the FEM analysis, under conditions that a soft pad is used, the entire area of the wafer is uniformly pressurized, and the Gap value (the distance from the inner circumference of a retainer ring part 105 to the edge of a wafer W) is several millimeters, the maximum compression stress at the edge part is 1.5 to 2 times smaller than the central part pressure. In the case of a wafer having a diameter of 300 [mm], the stress influence range is about 15 [mm] from the edge. From this analysis result, it was found that if a reduced processing pressure is applied to the outer circumferential edge part, the edge part stress can be made equal to the central part stress.

Figure 16:
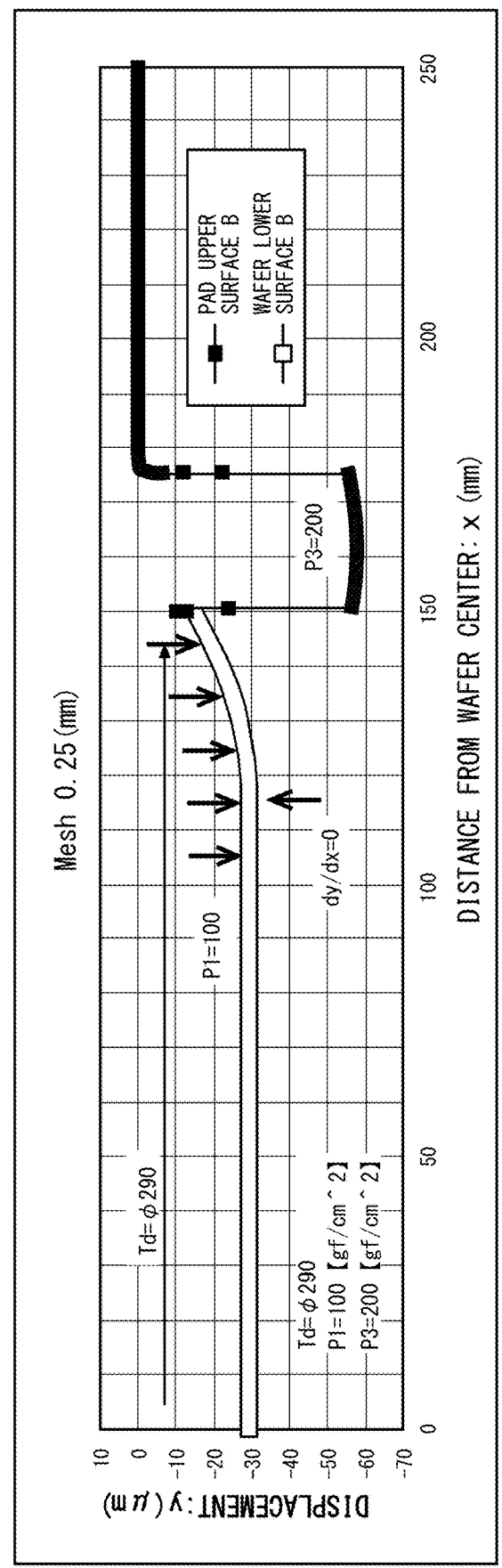
FIG. 16 is a diagram for illustrating a basic concept of mitigation of stress concentration at a wafer edge part.

FIG. 16 shows a result of analysis under conditions that a wafer having a diameter of 300 [mm] is used, and an edge part having a width of 5 [mm] of the wafer is set in a non-pressure state (the pressurized part has a diameter of 290 [mm]). Although this drawing shows displacement, the penetrating displacement of the edge part into the pad is about a half of that of the central part, which shows that the processing pressure is a reduced pressure. It is found that the pressure reduction phenomenon begins at about 30 [mm] from the edge, which is about six times greater than the non-pressure width of 5 [mm]. Based on this finding, a condition that provides ESFQR≈0 can be searched for by adjusting parameters such as the diameter of the pressurized part area, the retainer ring pressure, and the Gap value.

In the following, an example embodiment of the present invention will be described with reference to the drawings. A polishing treatment device according to this embodiment is directed to a substrate (referred to also as a wafer, hereinafter), such as a semiconductor wafer or a glass substrate, as a polishing target. In this specification, one of the surfaces of the substrate is referred to as a circular or substantially circular polished surface. A surface of the polishing pad that comes into contact with the polished surface of the wafer is referred to as a polishing surface.

The polishing treatment device includes a polishing table for horizontally rotating a polishing pad that is bonded to the polishing table and serves as a polishing member, and a polishing head for making a polished surface of a substrate face the polishing pad and bringing the polished surface into sliding contact with the polishing pad.

The substrate is pressed against the polishing pad by the polishing head. The polishing treatment of the polished surface is performed by rotating the polishing table and the polishing head while supplying a polishing liquid (slurry) to the polishing pad.

EXAMPLE EMBODIMENT

Figure 1:
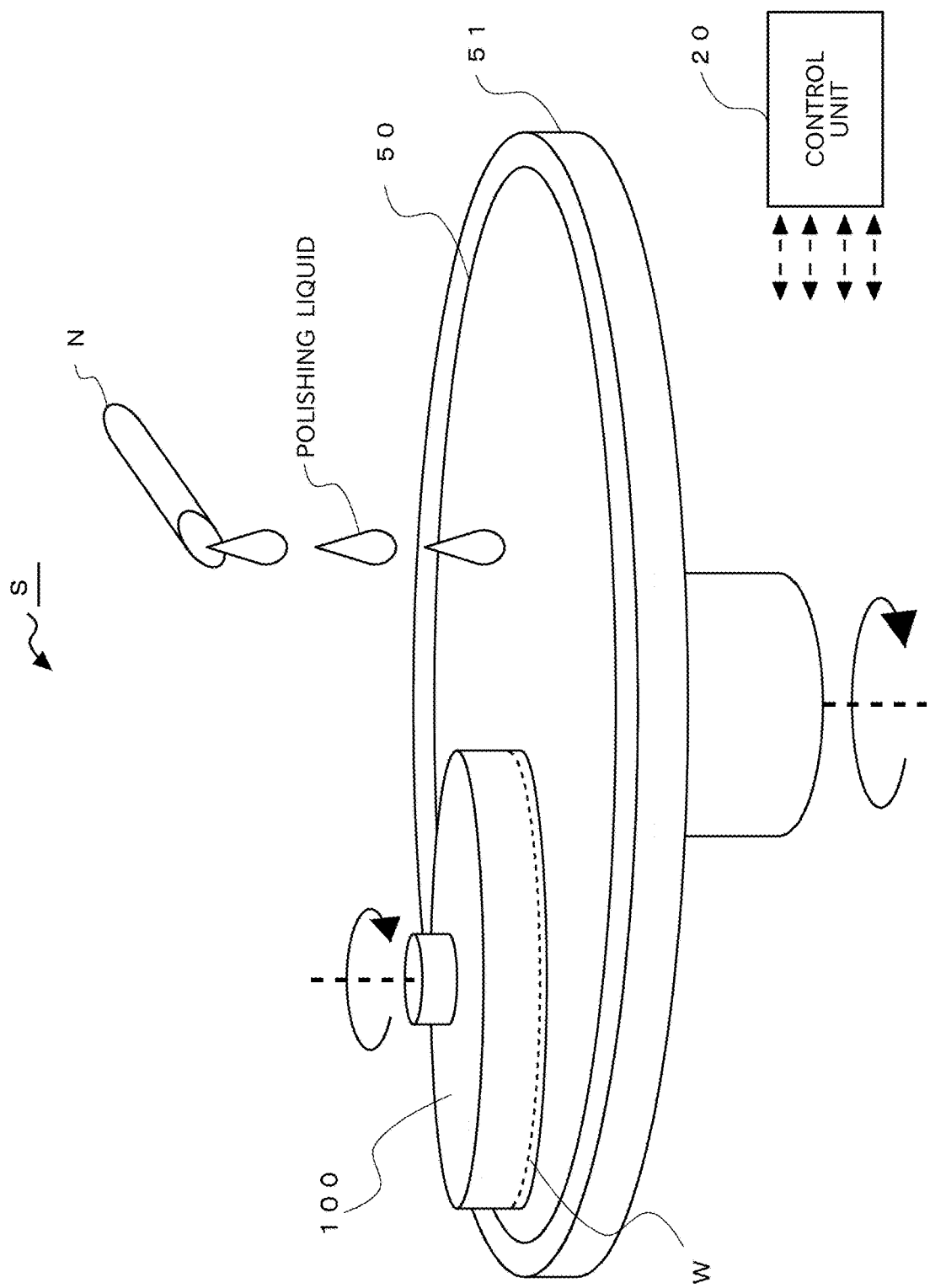
FIG. 1 is a diagram for illustrating an example of a polishing head of a polishing treatment device and a peripheral arrangement thereof.

FIG. 1 is a schematic diagram showing a configuration of a polishing treatment device S according to an embodiment.

The polishing treatment device S shown in FIG. 1 includes a polishing table 51, and a polishing pad 50 is bonded to a surface of the polishing table 51.

The polishing treatment device S further includes a polishing head 100 that holds a substrate (wafer) W and presses a polished surface of the substrate W against the polishing pad 50, a nozzle N that supplies a polishing liquid to the polishing pad 50, a motor (not shown) that horizontally rotates the polishing table 51 and the polishing head 100, a polishing liquid supply mechanism (not shown) connected to the nozzle N, and a control unit 20 including a computer that controls driving parts including the motor.

The polishing pad 50 has a disc-like shape, and the radius of the polishing pad 50 is greater than the maximum diameter (diameter) of the polished surface of the wafer W. With this mechanism, the number of revolutions and the direction of rotation of the polishing pad 50 and the polishing head 100 can be changed to adjust the relative polishing rate in the wafer W plane. The polishing pad 50 has an elasticity and may be made of a commercially-available material, such as nonwoven fabric or foamed urethane.

The polishing head 100 has a holding mechanism that holds the wafer W with the polished surface thereof in sliding contact with the polishing pad 50, and a pressing mechanism that applies a pressure to the held wafer W in a direction toward the polishing pad 50 from the back (back side) of the polished surface thereof. These mechanisms will be described in detail later.

The control unit 20 mainly performs positioning of the nozzle N, control of the start and stop of the supply of the polishing liquid from the nozzle N, control of the amount of supply per unit time of the polishing liquid ejected and supplied from the nozzle N, and control of the start and stop of the actuation of the motor, for example. The rotational force of the motor controlled by the control unit 20 is transmitted to the polishing table 51 via a driving part (not shown). In this way, the polishing table 51 horizontally rotates or stops rotating.

The rotational force (torque) from the motor is also transmitted to the polishing head 100 via a driving part (not shown, such as a universal joint). In this way, the polishing head 100 horizontally rotates or stops rotating.

The direction of rotation of the polishing table 51 and the direction of rotation of the polishing head 100 are typically the same. This is because if the directions of rotation are reverse directions, the relative polishing rate in the wafer plane may be uneven, and the even amount polishing may be unable to be achieved. The polishing accuracy can be improved by adjusting the rotational speed of the polishing table 51 and the polishing head 100 that are rotating in the same direction.

The rotational force of a single motor may be transmitted to the polishing table 51 and the polishing head 100 via gears with different gear ratios, or the rotational forces of motors may be separately transmitted to the polishing table 51 and the polishing head 100. These designs can be arbitrarily chosen. A control procedure by the control unit 20 will be described later.

The polishing liquid is supplied from the nozzle N to the polishing pad 50 for a predetermined time after the rotational speed of the polishing table 51 reaches a predetermined value under the control of the control unit 20.

Next, the polishing head 100 of the polishing treatment device S and a peripheral arrangement thereof will be described in detail.

[Polishing Head and Peripheral Arrangement]

Figure 2:
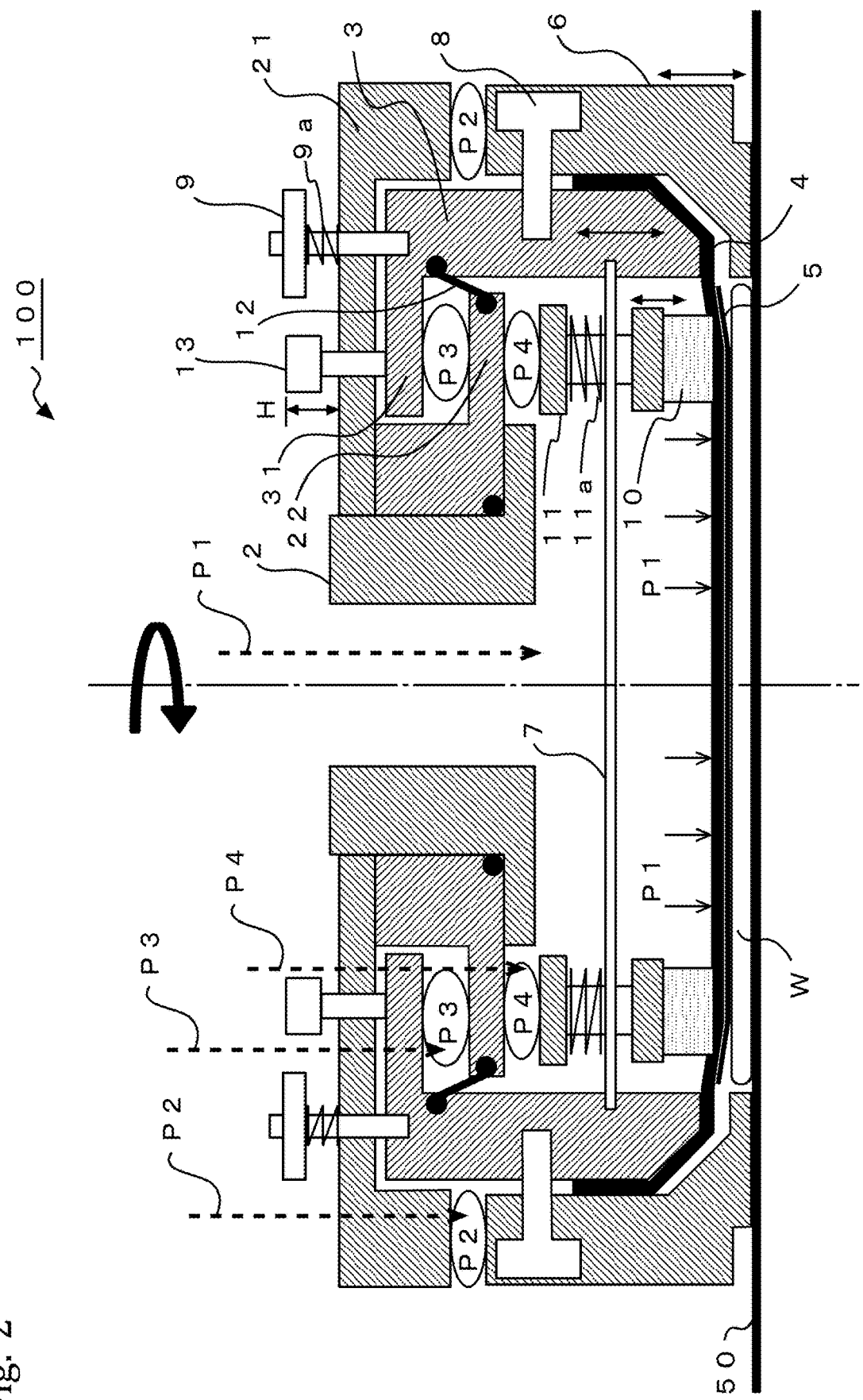
FIG. 2 is a schematic vertical cross-sectional view for illustrating the polishing head of the polishing treatment device and the peripheral arrangement thereof.

FIG. 2 is a schematic vertical cross-sectional view for illustrating an example of the polishing head 100 of the polishing treatment device S and a peripheral arrangement thereof. An example of a configuration of the polishing head 100 will be described with reference to FIG. 2.

In the description below, in order to further improve the global backside ideal range (GBIR) or the like of the wafer surface, the wafer W is held with the polished surface thereof in sliding contact with the polishing pad 50 under the pressure controlled by the polishing treatment device S, and the pressure is applied to the held wafer W in a direction toward the polishing pad 50 from the back (back side) of the wafer W opposite to the polished surface thereof.

[Configuration of Polishing Head]

Generally speaking, the polishing head 100 shown in FIG. 2 has a holding mechanism that brings the wafer W to be polished into sliding contact with the polishing pad 50 in a state where a polishing pressure (processing pressure) is applied to the wafer W, for example. The polishing head 100 also has a pressing mechanism that applies the polishing pressure (processing pressure) to the wafer W or presses a retainer ring 6 against the polishing pad 50.

The retainer ring 6 according to this embodiment prevents the wafer W energized by the rotational force of the polishing head 100 and the polishing table 51 from flying out in the radial direction. The retainer ring 6 is also involved with the contact pressure between the wafer edge part and the polishing pad 50.

The polishing head 100 includes a head housing 2, a membrane support ring 3, a membrane 4, a backing film 5, the retainer ring 6, and a flexible plate 7.

The polishing head 100 is configured so that a driving force (such as a rotational force (torque) from the motor, which is actuation means) is transmitted thereto via the flexible plate 7 connected to the head housing 2. Specifically, the membrane support ring 3 is connected to the flexible plate 7 connected to the head housing 2 (the connections are not shown), and the retainer ring 6 is connected to the membrane support ring 3 via a drive pin 8.

Thus, the components of the polishing head 100 can integrally horizontally rotate or stop rotating. The flexible plate 7 serves as driving means that integrally horizontally rotates the membrane support ring 3 and the retainer ring 6.

The start and stop of the rotation, the number of revolutions per unit time and the like are controlled by the control unit 20 based on specifications previously set.

The head housing 2 includes a first flange part 21 that extends outward from an upper position of a circumferential surface of a cylindrical body and a second flange part 22 that extends outward from a lower position of the circumferential surface of the cylindrical body. Although FIG. 2 shows an example in which the head housing 2 is formed by a combination of the first flange part 21 and the second flange part 22, the present invention is not limited to this, and the head housing 2 having the first flange part 21 and the second flange part 22 may be integrally formed.

The membrane support ring 3 is an annular body sized to surround the outer circumference of the second flange part 22 of the head housing 2, and includes a third flange part 31 formed at an upper end part thereof and located between the first flange part 21 and the second flange part 22. The membrane support ring 3 is made of SUS material, for example. Although FIG. 2 shows an example in which the membrane support ring 3 has the third flange part 31 as a separate part, the present invention is not limited to this, and the membrane support ring 3 may have the third flange part 31 as an integrated part.

The membrane 4 covers a lower end-side opening part of the membrane support ring 3 and holds the wafer W with the backing film 5 pasted to a front surface of the membrane 4 interposed therebetween. The membrane 4 is an elastic body of a cylindrical shape (cylindrical elastic body) formed in a substantially cylindrical (pan-like) shape having an inner diameter that allows the membrane 4 to be fitted around the outer circumferential surface of the membrane support ring 3. The membrane 4 is made of a rubber material having high strength and durability, such as ethylene propylene rubber (EPDM) or silicone rubber.

The backing film 5 is a thin film stretched on an outer bottom surface (outer surface) of the membrane 4. The backing film 5 may be made of a porous material, such as nonwoven fabric. The backing film 5 makes the polished surface of the wafer W face (abut against) the polishing pad 50 and holds the wafer W in sliding contact with the polishing pad 50. In this way, the membrane 4 and the backing film 5 serve as the holding mechanism that holds the wafer W.

The retainer ring 6 is shaped to surround the outer circumference of the wafer W. Not only does the retainer ring 6 prevent the wafer W energized by the rotational force of the polishing head 100 and the polishing table 51 from flying out in the radial direction, the retainer ring 6 is involved with controlling the contact pressure between the wafer edge part and the polishing pad 50.

The polishing head 100 is configured so that a clearance is formed between the edge part of the wafer W and the inner circumferential wall of the retainer ring 6 in the polishing processing. In addition, "pad retaining", which is pressing of the surface of the polishing pad 50 by the retainer ring 6, can be achieved with high accuracy functionally. In this way, the retainer ring 6 serves as a part of the pressing mechanism of the polishing head 100.

A gel-body ring 10 (referred to as an annular elastic body 10, hereinafter) is arranged on a back surface of the membrane 4 of the polishing head 100, and a corrective pressing ring 11 that applies a pressure to an upper surface of the annular elastic body 10 is arranged inside the membrane support ring 3 (annular body 3). Configurations of the annular elastic body 10 and the corrective pressing ring 11 will be described in detail below.

Figure 3:
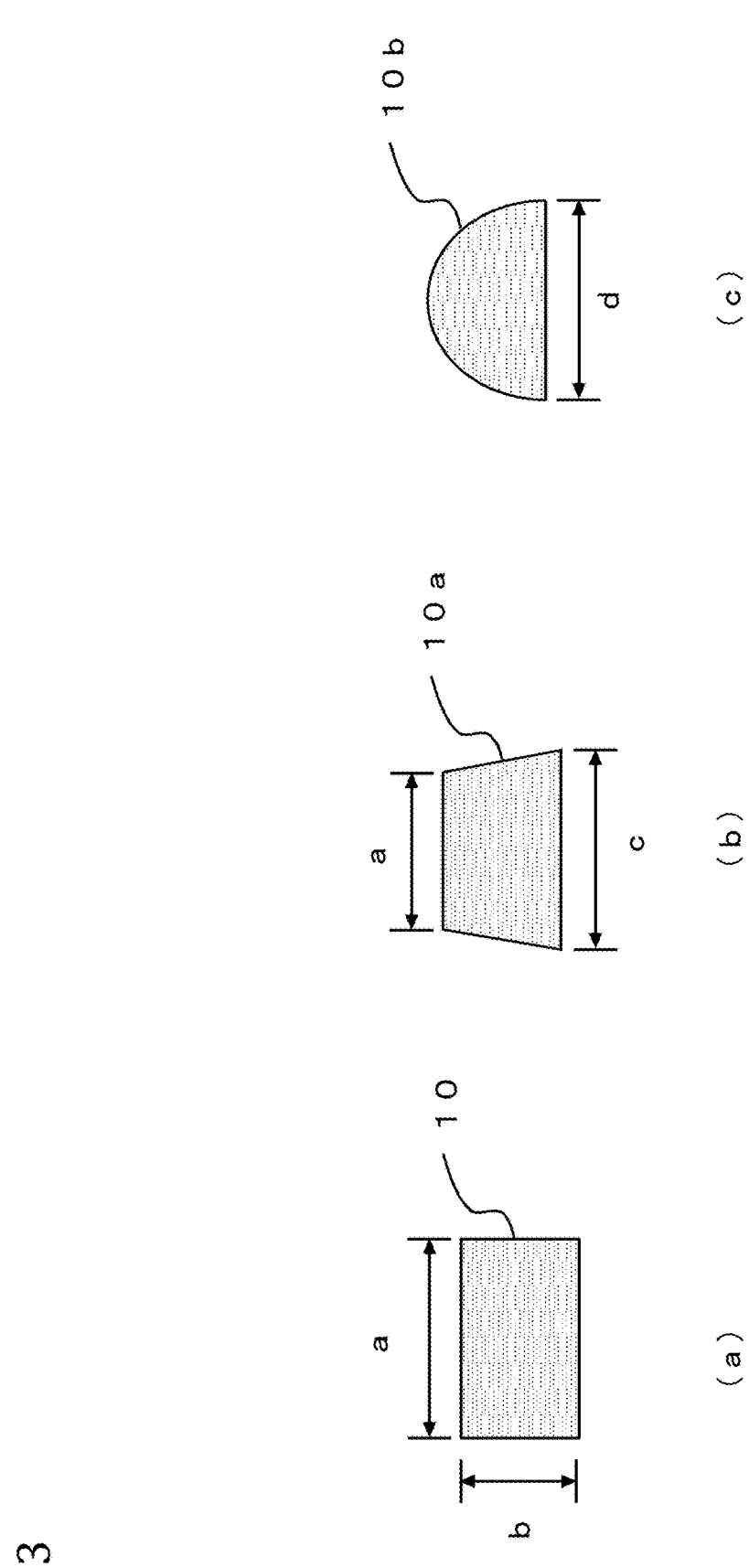
FIG. 3 are schematic vertical cross-sectional views showing examples of the cross-sectional shape of an annular elastic body (gel-body ring).

FIG. 3 are schematic vertical cross-sectional views showing examples of the cross-sectional shape of the annular elastic body 10.

The annular elastic body 10 is an elastic body formed in a ring shape and has a size smaller than the size of the wafer W. For example, the annular elastic body 10 can be formed to have a rectangular cross-sectional shape such as that shown in FIG. 3(a) (corresponding to the annular elastic body 10 in FIG. 2), a substantially trapezoidal shape with a larger bottom width and a smaller top width such as that shown in FIG. 3(b), or a substantially semi-circular cross-sectional shape such as that shown in FIG. 3(c).

The annular elastic body 10 may be made of H0-100·C (soft), H5-100·C7 (medium), or H15-100·C15 (hard), which are available from EXCEAL Co., Ltd., for example.

The hardness of the gel used, the width and height of the gel-body ring, the indenter shape of the corrective pressing ring 11 and the like are chosen according to the pressure bulb described later, and these are set by determining a "compensating pressure pattern" of a compensating pressure applied to a back-side outer circumference vicinity (near-edge region) of the wafer W opposite to the polished surface of the wafer W. The indenter shape means the pressing surface shape of the corrective pressing ring 11 that presses the upper surface of the annular elastic body 10.

Figure 4:
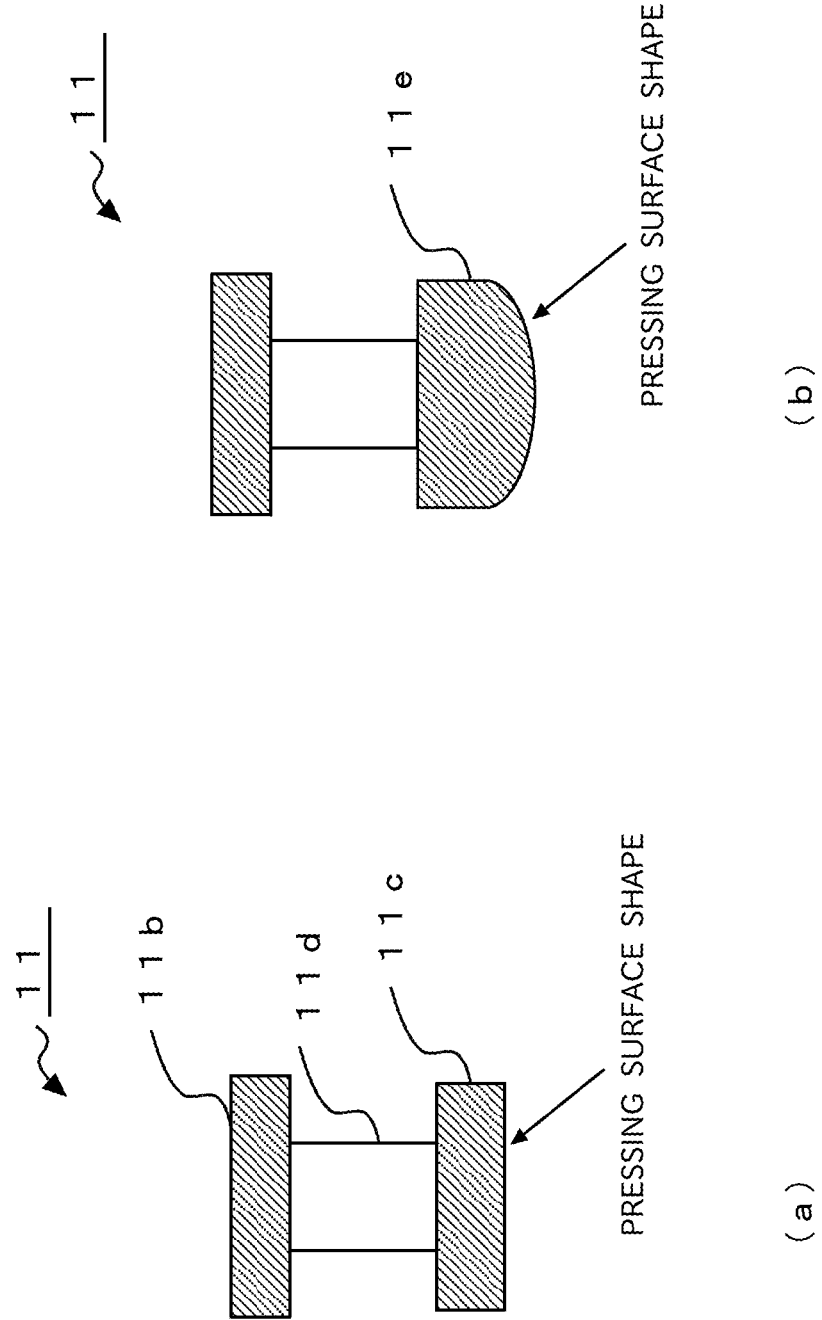
FIG. 4 are schematic vertical cross-sectional views showing examples of the cross-sectional shape of a corrective pressing ring.

FIG. 4 are schematic vertical cross-sectional views showing examples of the cross-sectional shape of the corrective pressing ring 11.

The corrective pressing ring 11 includes an upper surface part 11b and a lower surface part 11c that are formed in a ring shape, and a plurality of connection parts 11d formed in a cylindrical shape. The upper surface part 11b and the lower surface part 11c are connected to each other by the connection parts 11d. The corrective pressing ring 11 is held by the flexible plate 7 connected to the membrane support ring 3.

Specifically, the corrective pressing ring 11 is held with the connection parts 11d movably inserted in holes (not shown) formed in the flexible plate 7.

The pressing surface shape of the corrective pressing ring 11 may be a flat pressing surface shape such as that shown in FIG. 4(a) or a pressing surface shape having a substantially semi-circular cross-sectional shape such as that shown in FIG. 4(b).

The pressing surface shape of the corrective pressing ring 11 is designed by considering the hardness of the gel used, the width and height of the gel-body ring and the like according to the pressure bulb described later, and determined by determining the "compensating pressure pattern" of the compensating pressure applied to the back-side outer circumference vicinity (near-edge region) of the wafer W opposite to the polished surface of the wafer W.

[Pressing Mechanism]

With the polishing head 100, as shown in FIG. 2, the space defined by the second flange part 22 of the head housing 2, the membrane support ring 3 (annular body 3) and the membrane 4 provides a pressure chamber (sealed air chamber) for applying a pressure to the wafer W toward the polishing pad 50 from the back (back side) of the polished surface thereof. The pressure chamber formed in the polishing head 100 is a space corresponding to a region above the part of the membrane 4 to which the backing film 5 is attached.

The second flange part 22 of the head housing 2 and the membrane support ring 3 (annular body 3) are connected to each other by a sealing partition wall 12. The sealing partition wall 12 is made of an elastic material, such as rubber.

The polishing head 100 of the polishing treatment device S is configured so that a pressure fluid (such as compressed air) can be supplied to or collected from the pressure chamber through an air pipe coupled to a fluid supply mechanism (not shown). That is, the polishing head 100 is configured so that a processing pressure P1 applied to the wafer W can be produced by adjusting the amount of the pressure fluid supplied to the pressure chamber (as shown by the dashed line P1 in FIG. 2).

This arrangement serves as first pressure adjusting means that adjusts the processing pressure P1 applied to the back side of the wafer W opposite to the polished surface by adjusting the pressure in the space (pressure chamber) surrounded by the head housing 2 (second flange part 22), the membrane support ring 3 and the membrane 4 under the control of the control unit 20.

Figure 5:
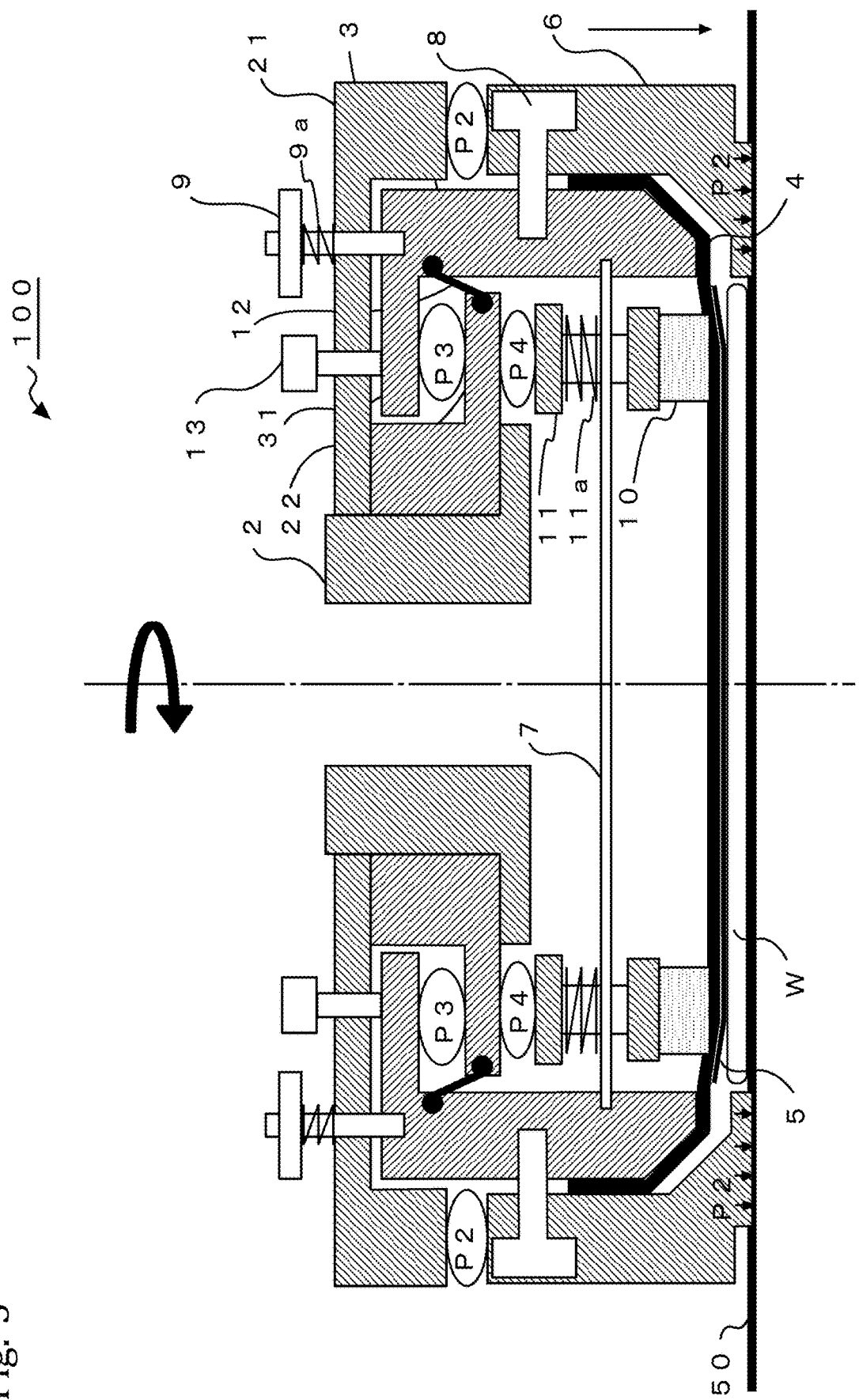
FIG. 5 is a diagram for illustrating "pad retaining" that is pressing of a polishing pad surface by a retainer ring.

FIG. 5 is a diagram for illustrating the "pad retaining" that is pressing of the surface of the polishing pad 50 by the retainer ring 6.

With the polishing head 100 of the polishing treatment device S, as shown in FIG. 2, an air bag P2 is arranged between the first flange part 21 of the head housing 2 and the retainer ring 6.

Furthermore, as shown in FIG. 2, the polishing head 100 of the polishing treatment device S is configured so that the pressure fluid (such as compressed air) can be supplied to or collected from the air bag P2 through an air pipe coupled to the fluid supply mechanism (not shown). That is, the polishing head 100 is configured so that a pressure P2 with which the retainer ring 6 presses the surface of the polishing pad 50 can be produced by adjusting the amount of the pressure fluid supplied to the air bag P2 (as shown by the dashed line P2 in FIG. 2).

The air bag P2 is formed in a ring shape, and expands when the air bag P2 is filled with the pressure fluid. As shown in FIG. 5, this allows the retainer ring 6 to press the polishing pad 50 with the pressure P2 according to the amount of the pressure fluid in the air bag P2.

This arrangement serves as second pressure adjusting means that adjusts the pressure P2 applied to the polishing pad 50 by the retainer ring 6 by means of the first flange part 21 by adjusting the amount of the pressure fluid supplied to the air bag P2 under the control of the control unit 20. In other words, the second pressure adjusting means is intended to optimize the wafer edge part stress.

Figure 6:
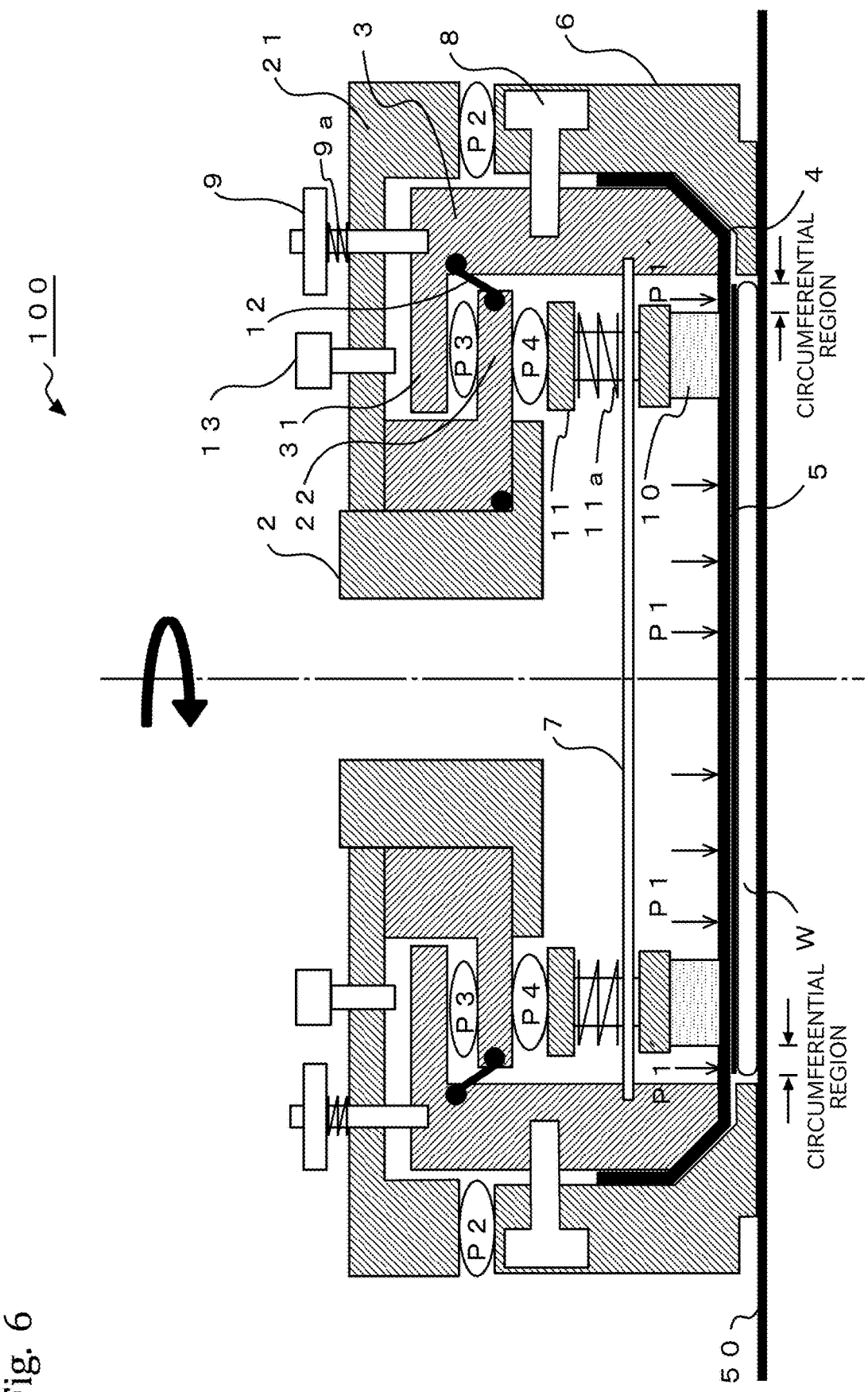
FIG. 6 is a schematic vertical cross-sectional view for illustrating an operation of raising or lowering a membrane support ring.

FIG. 6 is a schematic vertical cross-sectional view for illustrating an operation of raising or lowering of the membrane support ring 3.

With the polishing head 100 of the polishing treatment device S, as shown in FIG. 2, an air bag P3 is arranged between the second flange part 22 of the head housing 2 and the third flange part 31 of the membrane support ring 3.

Furthermore, as shown in FIG. 2, the polishing head 100 of the polishing treatment device S is configured so that the pressure fluid (such as compressed air) can be supplied to or collected from the air bag P3 through an air pipe coupled to the fluid supply mechanism (not shown). That is, the polishing head 100 is configured so that the membrane support ring 3 can be raised or lowered by adjusting the amount of the pressure fluid supplied to the air bag P3 (as shown by the dashed line P3 in FIG. 2).

The air bag P3 is formed in a ring shape, and expands when the air bag P3 is filled with the pressure fluid. As a result, as shown in FIG. 6, the membrane support ring 3 is raised (FIG. 2) or lowered (FIG. 6) according to the amount of the pressure fluid in the air bag P3. That is, the membrane 4 and the backing film 5 are also raised or lowered in response to the operation of raising or lowering the membrane support ring 3.

As the membrane 4 and the backing film 5 is raised or lowered as the membrane support ring 3 is raised or lowered, the area of the circumferential region of the wafer W that is in contact with the backing film 5 varies. In response to this variation, the processing surface pressure also varies which is applied to the back-side circumference region of the wafer W opposite to the polished surface of the wafer W (see FIGS. 2, 6, and 16).

As a result of the circumferential part of the membrane 4 being raised by the air bag P3, a region in which the processing surface pressure is applied (referred to as a pressurized circumferential band) and a region in which the processing surface pressure is not applied (referred to as a non-pressurized circumferential band) are formed in the circumferential part of the wafer W. The annular elastic body 10 is arranged with the centerline of the bottom surface thereof aligned with the boundary between the pressurized circumferential band and the non-pressurized circumferential band of the membrane 4 and the wafer W (see FIG. 11, for example). By arranging the annular elastic body 10 in this way, the principle and mechanism of ESFQR≈0, which cannot be elucidated with the conventional polishing heads, can be elucidated, and GBIR can also be dramatically improved.

This arrangement serves as third pressure adjusting means that adjusts, by means of the second flange part 22, a pressurized area P1' in which the pressure is applied to the back-side circumference opposite to the polished surface via the third flange part 31, by adjusting the differential pressure against the processing pressure under the control of the control unit 20.

The polishing head 100 of the polishing treatment device S includes a stopper 13 as restraining means that restrains the raising of the membrane support ring 3 within a predetermined range. The stopper 13 is foiled by a screw, for example.

Figure 7:
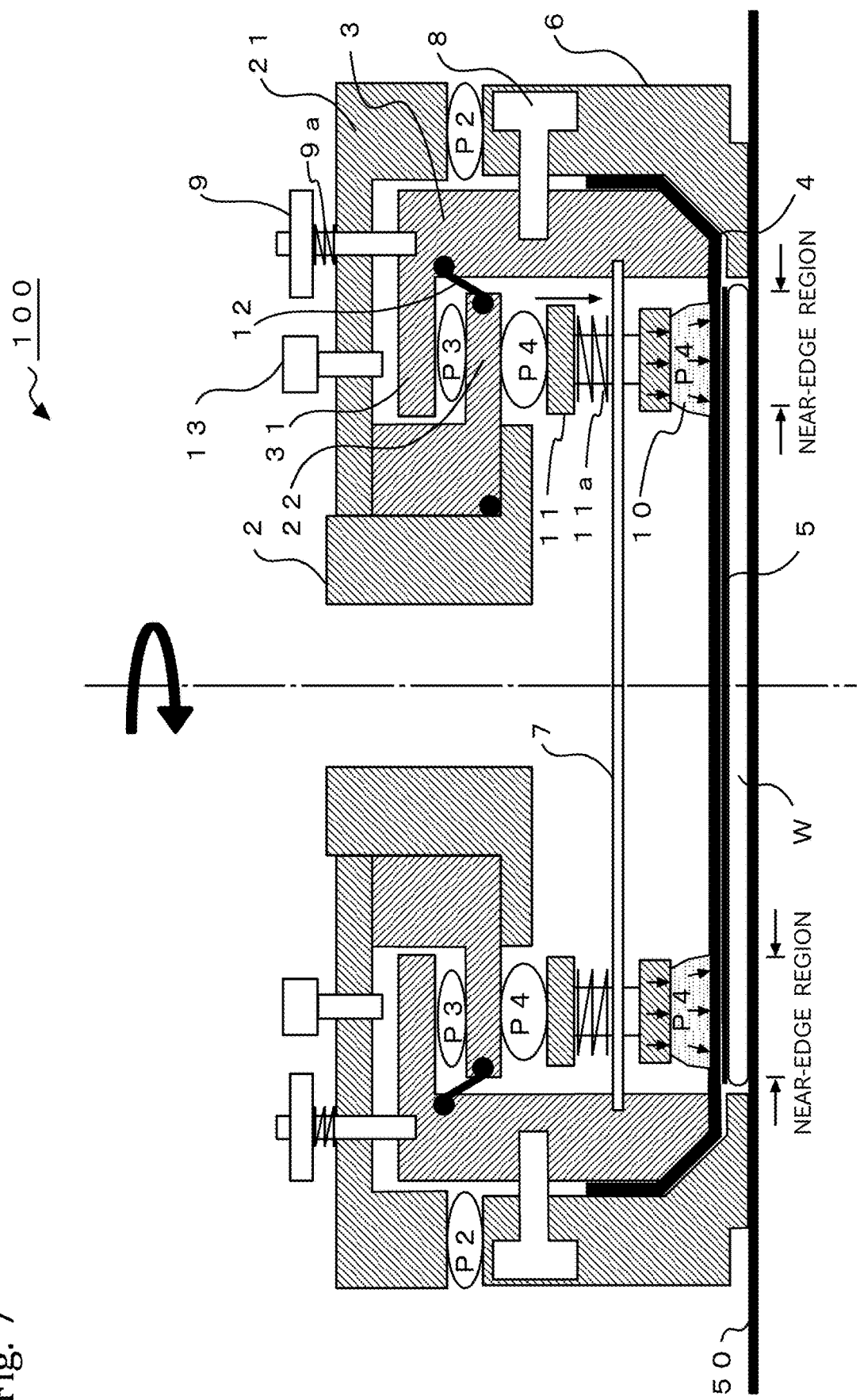
FIG. 7 is a schematic vertical cross-sectional view for illustrating an operation of the corrective pressing ring.

FIG. 7 is a schematic vertical cross-sectional view for illustrating an operation of the corrective pressing ring 11.

As described above, the annular elastic body 10 is arranged on the back side of the membrane 4 of the polishing head 100, and the corrective pressing ring 11 that applies a pressure to the upper surface of the annular elastic body 10 is arranged. In addition, as shown in FIG. 2, an air bag P4 is arranged between the second flange part 22 of the head housing 2 and the corrective pressing ring 11.

Furthermore, as shown in FIG. 2, the polishing head 100 of the polishing treatment device S is configured so that the pressure fluid (such as compressed air) can be supplied to or collected from the air bag P4 through an air pipe coupled to the fluid supply mechanism (not shown). That is, the polishing head 100 is configured so that the corrective pressing ring 11 can be raised or lowered by adjusting the amount of the pressure fluid supplied to the air bag P4 (as shown by the dashed line P4 in FIG. 2).

In this embodiment, the operation of raising the corrective pressing ring 11 is achieved by a biasing force of a spring 11a.

The air bag P4 is formed in a ring shape, and expands when the air bag P4 is filled with the pressure fluid. As a result, as shown in FIG. 7, the corrective pressing ring 11 is raised (FIG. 2) or lowered (FIG. 6) according to the amount of the pressure fluid in the air bag P4. That is, the pressure applied to the upper surface of the annular elastic body 10 varies in response to the operation of raising or lowering the membrane support ring 3.

The pressure applied to the upper surface of the annular elastic body 10 varies in response to the operation of raising or lowering the corrective pressing ring 11. In response to this variation, the compensating pressure pattern of a compensating pressure P4 applied to the back-side outer circumference vicinity (near-edge region) of the wafer W opposite to the polished surface also varies (see FIGS. 2 and 7).

This arrangement serves as fourth pressure adjusting means that adjusts, by means of the second flange part 22, the compensating pressure P4 applied to the back-side outer circumference vicinity (near-edge region) of the wafer W opposite to the polished surface by adjusting the contribution of the pressure fluid supplied to the air bag P4 to the processing pressure applied to the back side of the wafer W opposite to the polished surface under the control of the control unit 20.

[Polishing Treatment]

Next, a polishing treatment performed by the polishing treatment device S according to this embodiment will be described.

The polishing treatment performed by the polishing treatment device S according to this embodiment begins with determining an operating condition (treatment condition), which is determined based on characteristics of a lot of wafers or the status of the polishing treatment device. After that, the continuous polishing treatment (mass production) of wafers is performed based on the operating condition.

Steps of determining the operating condition (treatment condition) will be described below.

[Determination of Pressure P2]

Figure 8:
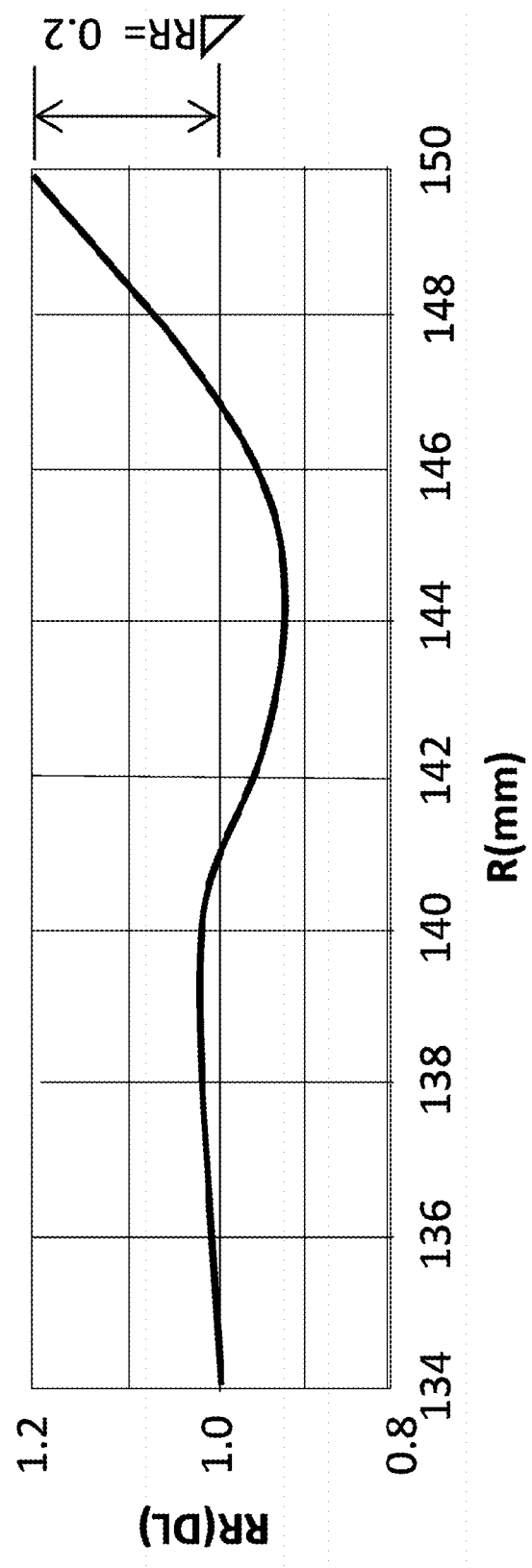
FIG. 8 is a graph showing RR after polishing (in dimensionless numbers).

FIG. 8 is a graph showing an RR curve at the wafer edge part before and after polishing. The vertical axis indicates the removal rate RR [μm/min] in dimensionless numbers, and the horizontal axis indicates the radial position [mm] on the wafer. In this example, $\Delta RR = 0.2$ is observed.

As a first step, the air bag P3 is set in a non-pressure state in which no pressure fluid is supplied. As a result, the membrane support ring 3 is in a lowered state (see FIG. 6). The air bag P4 is also set in the non-pressure state in which no pressure fluid is supplied. As a result, the corrective pressing ring 11 applies no pressing force to the upper surface of the annular elastic body 10.

An adjustment is then made so that RR=1.2 is achieved by applying the processing pressure P1 to the wafer W and at the same time adjusting the pressure P2 with which the retainer ring 6 presses the surface of the polishing pad 50 (Pr=1.75*P1). In this example, ΔRR=0.2 is observed.

ΔRR shown in FIG. 8 substantially varies with Gap. Gap varies between 0 and 1 [mm] in one rotation of the wafer about the rotational coordinate axis thereof, and therefore, ΔRR is more accurately measured by finding an average behavior from actual operation data than by using a static surface pressure sheet.

[Compensation Curve]

Figure 9:
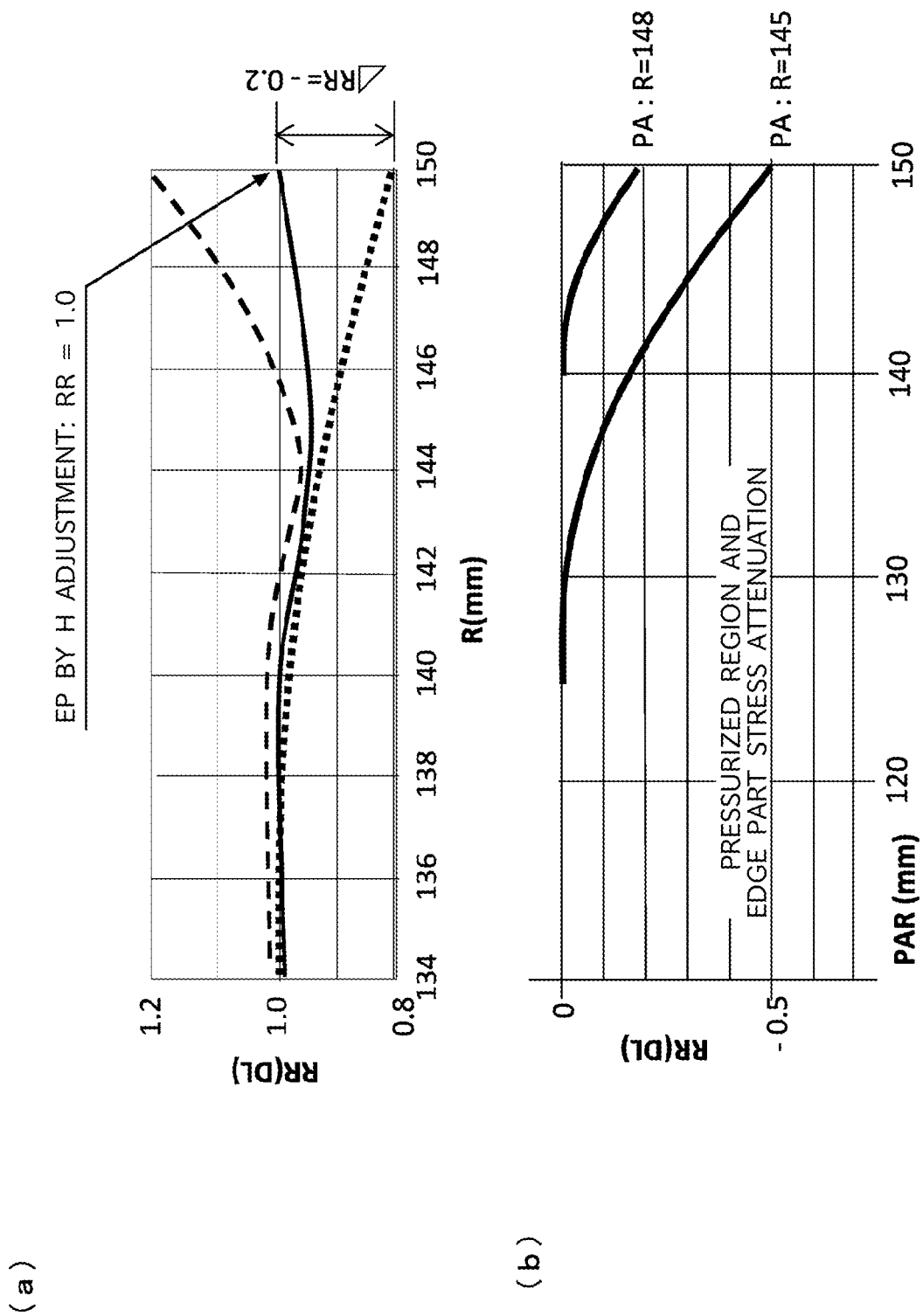
FIG. 9(a) is a graph for illustrating a surface pressure matching method for an outermost edge part and a central part of a wafer.
FIG. 9(b) is a diagram showing an example relationship between a pressurized region and an edge stress attenuation.

FIG. 9(*a*) is a graph for illustrating a surface pressure matching method for the outermost edge part and the central part of the wafer. The vertical axis indicates the removal rate RR [μm/min] in dimensionless numbers, and the horizontal direction indicates the radial position [mm] on the wafer.

As can be seen from the graph of FIG. 9(*a*), a compensation curve indicated by the black solid line is obtained by averaging of the black dashed line (polishing RR) and the black dotted line (pressure attenuation).

FIG. 9(*b*) is a diagram showing an example relationship between a pressurized region and an edge part stress attenuation, and also is a graph showing a curve showing a relationship between the edge part stress attenuation and the wafer back-side contact area with the membrane, that is, the radius (PAR) of the loaded area. The vertical axis indicates the removal rate RR [μm/min] in dimensionless numbers, and the horizontal direction indicates the radial position [mm] on the wafer.

[Position Adjustment (H) of Raising Operation of Membrane Support Ring 3]

As a second step, the pressure fluid is supplied to the air bag P3. As a result, the membrane support ring 3 is raised (see FIG. 2). Using a stopper 13 (position adjustment: height H) that restrains the raising of the membrane support ring 3 within a predetermined range, an adjustment is made so that RR=1.0 is achieved at an edge point. The air bag P4 remains in the non-pressure state in which no pressure fluid is supplied.

The adjustment can be performed by measuring H versus RR (DL) using a surface pressure sheet. Measurement of H can be achieved using LS-100CN available from Optex Co., Ltd., for example.

Figure 10:
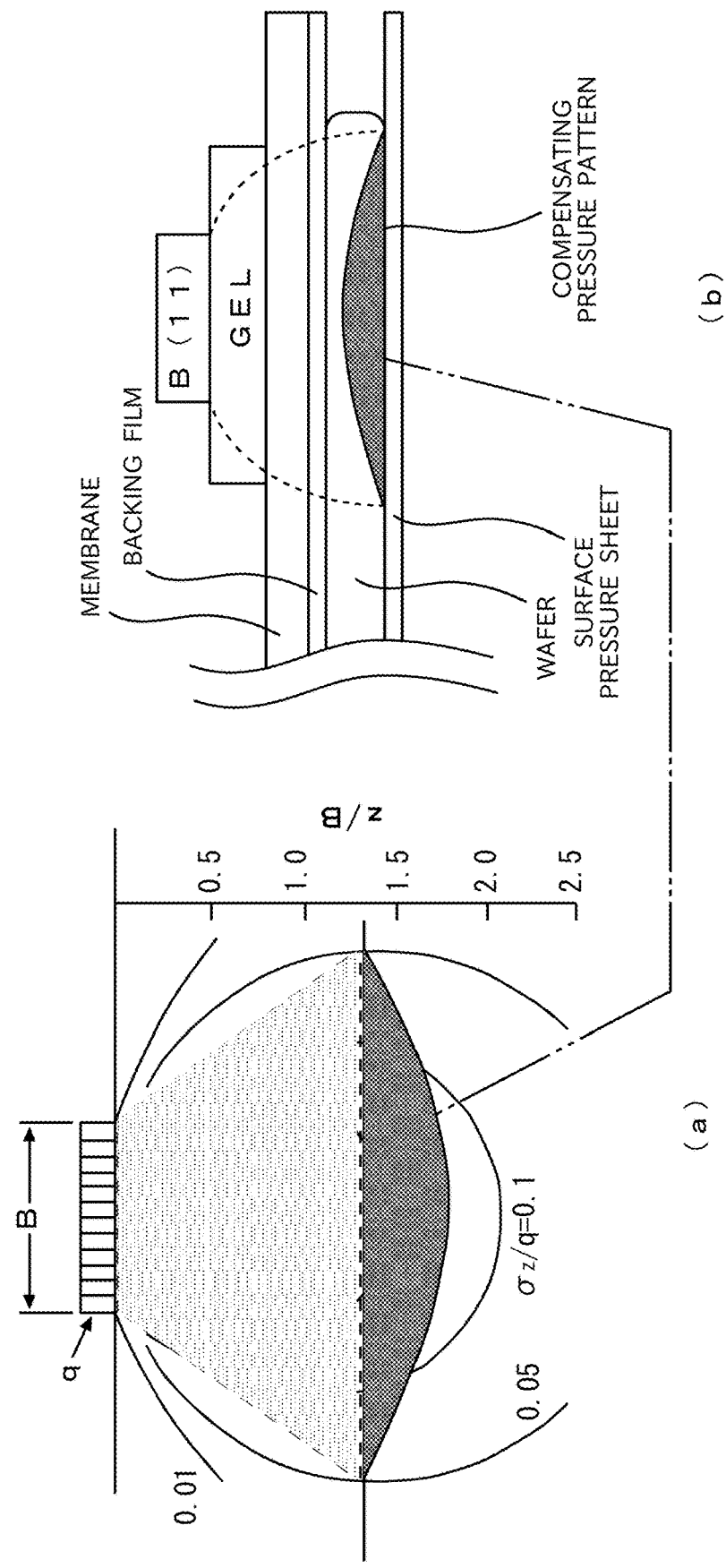
FIGS. 10(a) and 10(b) are diagrams for illustrating an example of a compensating pressure pattern designed based on the pressure bulb.

FIG. 10 are diagrams for illustrating an example of the compensating pressure pattern designed based on the pressure bulb. FIG. 10(*a*) shows an example of the range in which a load (surface pressure width: B, unit area pressure: q) and a stress act according to the pressure bulb.

As shown in FIGS. 10, the compensating pressure P4 applied to the back-side outer circumference vicinity (near-edge region) of the wafer W opposite to the polished surface by the corrective pressing ring 11 via the annular elastic body 10 is transmitted according to the pressure bulb behavior, and the compensating pressure pattern is thus formed.

The measurement of the compensating pressure pattern can be performed using I-SCAN20-F02 (resolution pitch: 0.2 [mm]) available from Tekscan, Inc., for example.

Figure 11:
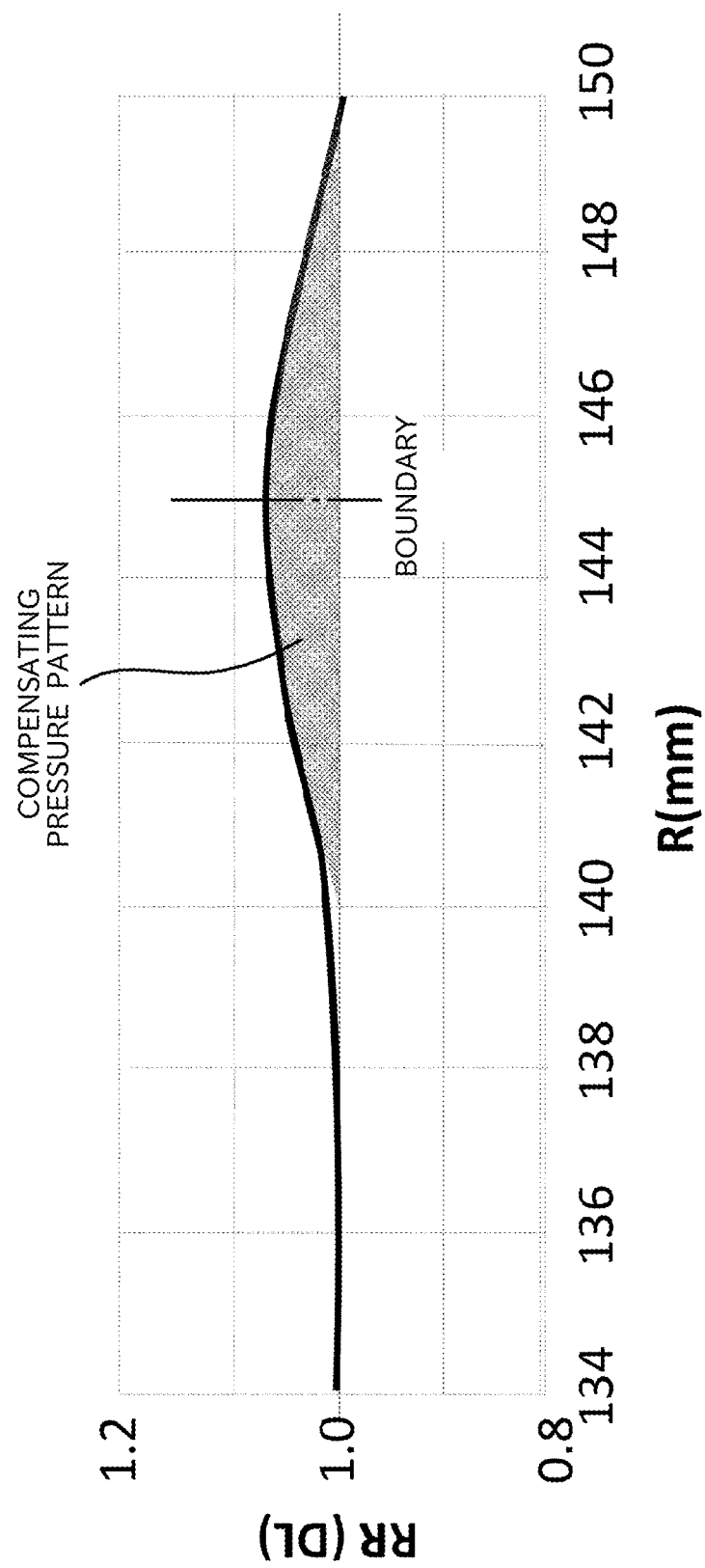
FIG. 11 is a diagram showing an example distribution curve (compensating pressure pattern) of a compensating pressure on a back-side outer circumference vicinity of a wafer W opposite to the polished surface.

FIG. 11 is a diagram showing an example distribution curve (compensating pressure pattern) of the compensating pressure on the back-side outer circumference vicinity (near-edge region) of the wafer W opposite to the polished surface (the recessed part shown by the black solid line in FIG. 9(*a*) is compensated for). The vertical axis indicates the removal rate RR [mm/min] in dimensionless numbers, and the horizontal axis indicates the radial position [mm] on the wafer.

Through the first step and the second step, the compensating pressure pattern of the compensating pressure P4 applied to the back-side outer circumference vicinity (near-edge region) of the wafer W opposite to the polished surface by the corrective pressing ring 11 via the annular elastic body 10 is determined as shown in FIG. 11.

[Control Procedure for Polishing Treatment]

Figure 12:
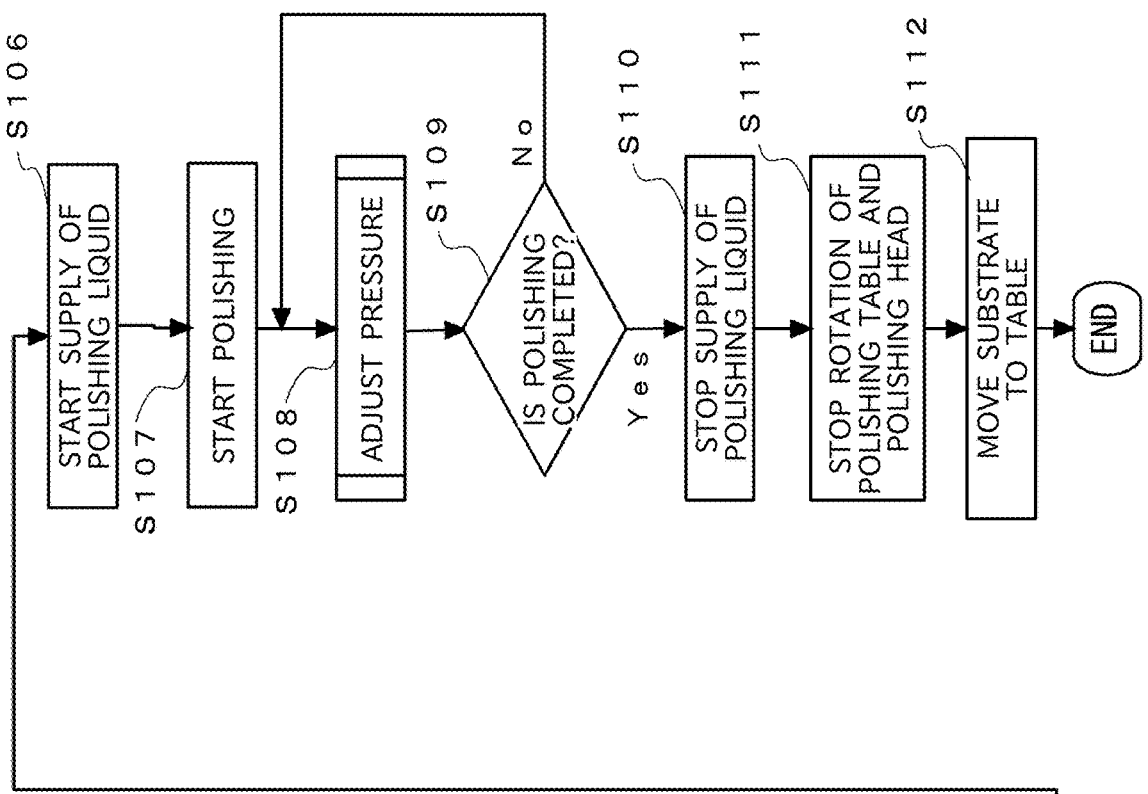
FIG. 12 is a flowchart for illustrating an example of a main control procedure by a control unit when performing a polishing treatment.
Figure 12:
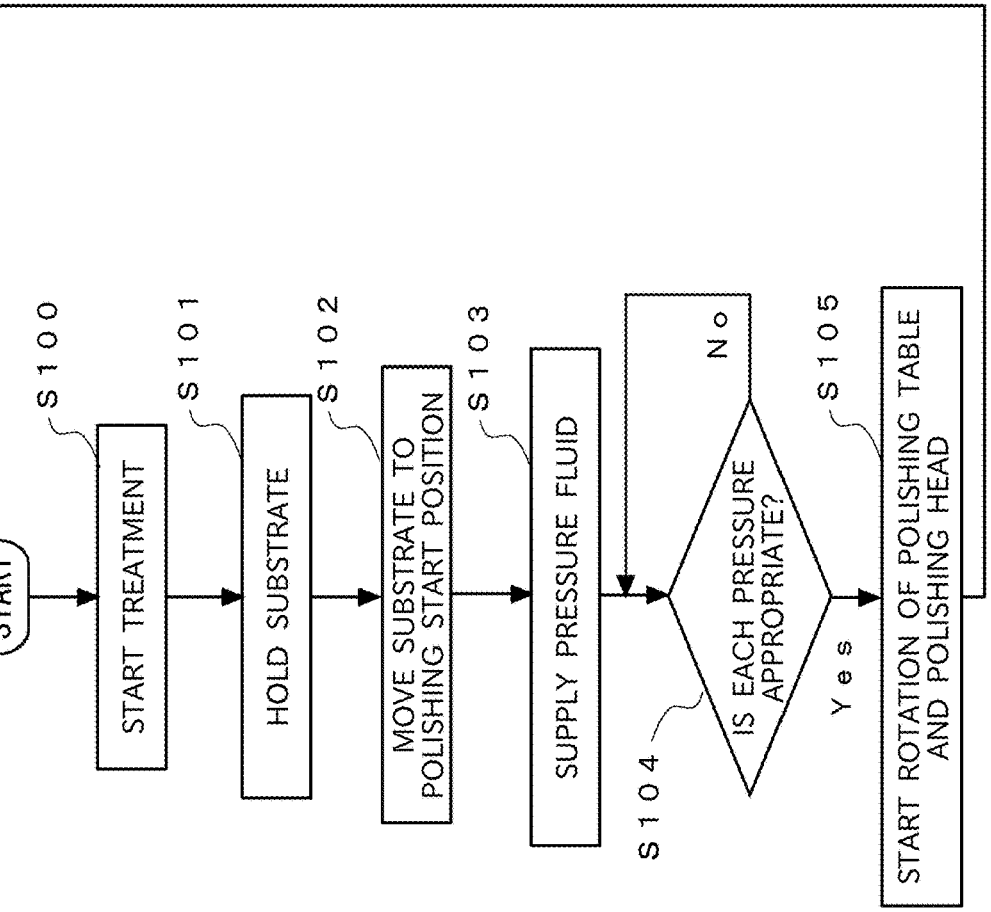

Next, a treatment procedure by the polishing treatment device S according to this embodiment will be described. FIG. 12 is a flowchart for illustrating an example of a main control procedure by the control unit 20 when performing the polishing treatment. The treatment procedure described below is to perform the continuous polishing treatment (mass production) of wafers under the operating condition described above.

The control unit 20 starts the control in response to receiving a start instruction input from an operator of the polishing treatment device S (S100). It is assumed that, as the operating condition, the compensating pressure pattern of the compensating pressure P4 applied to the back-side outer circumference vicinity (near-edge region) of the wafer W opposite to the polished surface by the corrective pressing ring 11 via the annular elastic body 10 has been obtained.

After a predetermined initial processing, the control unit 20 makes the holding mechanism of the polishing head 100 start holding the wafer W (S101).

The control unit 20 makes the polishing head 100 having received the wafer W from a wafer passing table (not shown) to a polishing treatment start position (S102).

The control unit 20 adjusts the processing pressure P1, the pressurized area P1', and the pressure P2 by supplying a predetermined amount of pressure fluid to each of the pressure chamber, the air bag P2, and the air bag P3 (S103).

When it is confirmed that each pressure according to the amount of supply of the pressure fluid is appropriate (Yes in S104), the control unit 20 issues, to a motor (not shown), an instruction to start rotating the polishing table 51 and the polishing head 100 (S105). In response to this, the polishing table 51 and the polishing head 100 start to horizontally rotate.

After instructing to start rotating the polishing table 51 and the polishing head 100, the control unit 20 instructs to position the nozzle N and issues an instruction to start the supply of the polishing liquid to the polishing liquid supply mechanism (S106). In response to this, the polishing liquid is supplied from the nozzle N to the surface of the polishing pad 50. In this way, the control unit 20 starts the polishing (S107).

The control unit 20 starts the pressure adjustment of the processing pressure based on the operating condition (S108). Here, the pressure adjustment in the processing of step S108 will be described. Generally speaking, the pressure adjustment in the processing of step S108 includes a first step and a second step.

In the first step, the control unit 20 makes the first pressure adjusting means described above apply the processing pressure P1 to the back side of the wafer W opposite to the polished surface, makes the second pressure adjusting means apply the pressure P2 to the polishing pad 50, and makes the third pressure adjusting means raise the membrane support ring 3, thereby adjusting the pressurized area P1' so that the processing pressure on the back-side circumference of the wafer W opposite to the polished surface is smaller than the processing pressure P1 applied by the first pressure adjusting means. In this step, the control unit 20 controls so that the air bag P4 is in the non-pressure in which no pressure fluid is supplied.

In the second step, the control unit 20 makes the first pressure adjusting means described above stop applying the processing pressure P1, makes the second pressure adjusting means described above apply the pressure P2 to the polishing pad 50, and makes the third pressure adjusting means described above lower the membrane support ring 3, thereby releasing the processing pressure-reduced state (the state of the pressurized area P1') at the back-side circumference of the wafer W opposite to the polished surface, and controls the fourth pressure adjusting means described above to apply the compensating pressure P4 to the back-side outer circumference vicinity (near-edge region) of the wafer W opposite to the polished surface.

Switching between the first step and the second step is achieved in an internal sequence while the polishing table 51 and the polishing head 100 are kept rotating.

The control unit 20 then determines whether or not the polishing is completed (S109). This determination is based on a detection result from a sensor, for example, and the polishing is ended when it is determined that the wafer W is polished to a desired thickness. Otherwise (No in S109), the procedure returns to the processing of step S108.

When it is determined that the polishing is completed (Yes in S109), the control unit 20 instructs the polishing liquid supply mechanism to stop supplying the polishing liquid (S110).

The control unit 20 then issues a stop instruction to the motor to stop the rotation of the polishing table 51 and the polishing head 100 (S111). The polishing head 100 is then moved to a table on which polished wafers W are to be placed (S112). This is the end of the polishing treatment.

Whether holding of the wafer is released or not can be determined by using various sensors (not shown), for example. The pressure fluid supplied may be collected after the rotation of the polishing table 51 and the polishing head 100 is stopped. Such a control can prevent the polished wafer W from accidentally dropping while the wafer is being conveyed.

Figure 13:
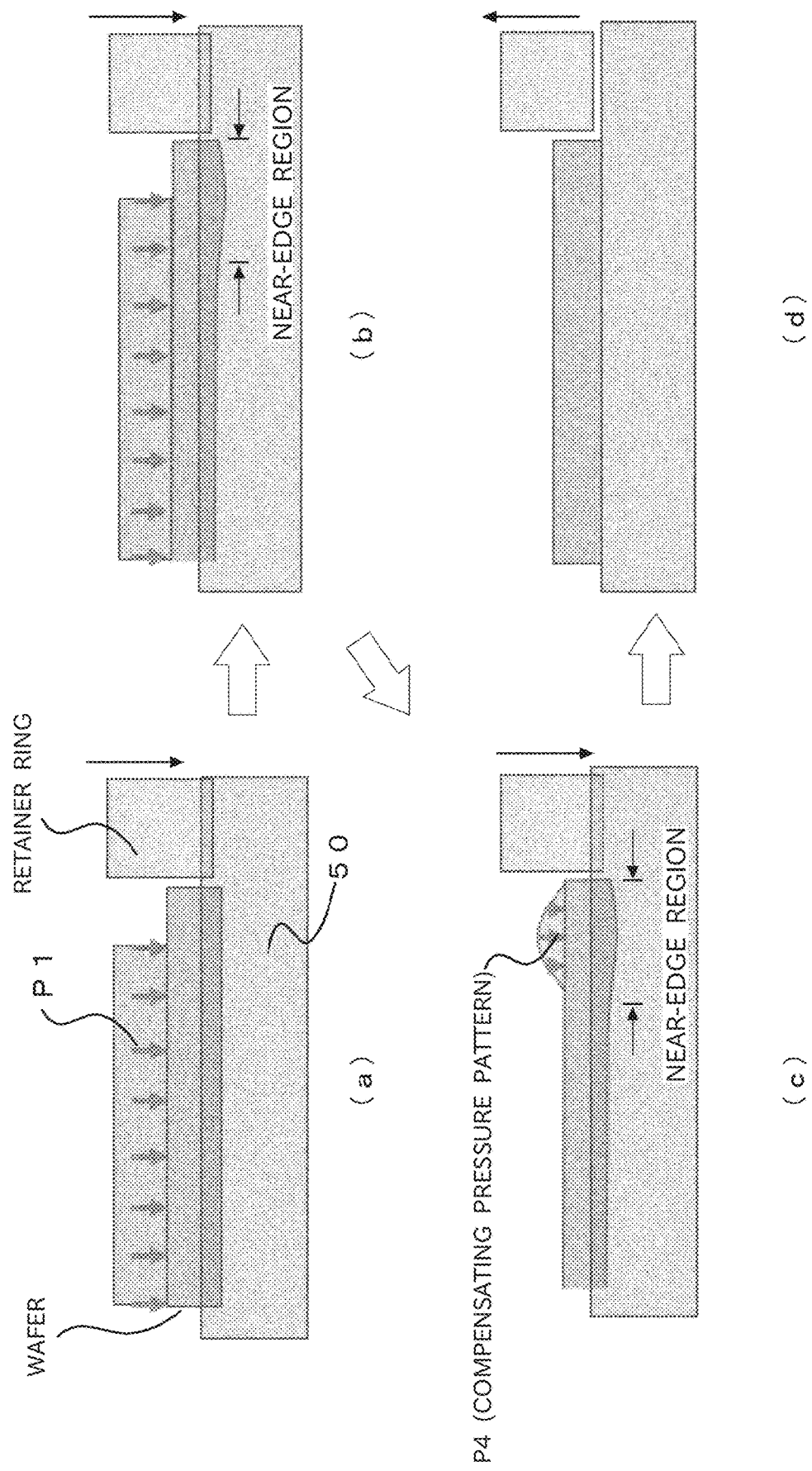
FIGS. 13(a) to 13(d) are schematic diagrams for illustrating a first step and a second step in processing of step S108 shown in FIG. 12.
Figure 14:
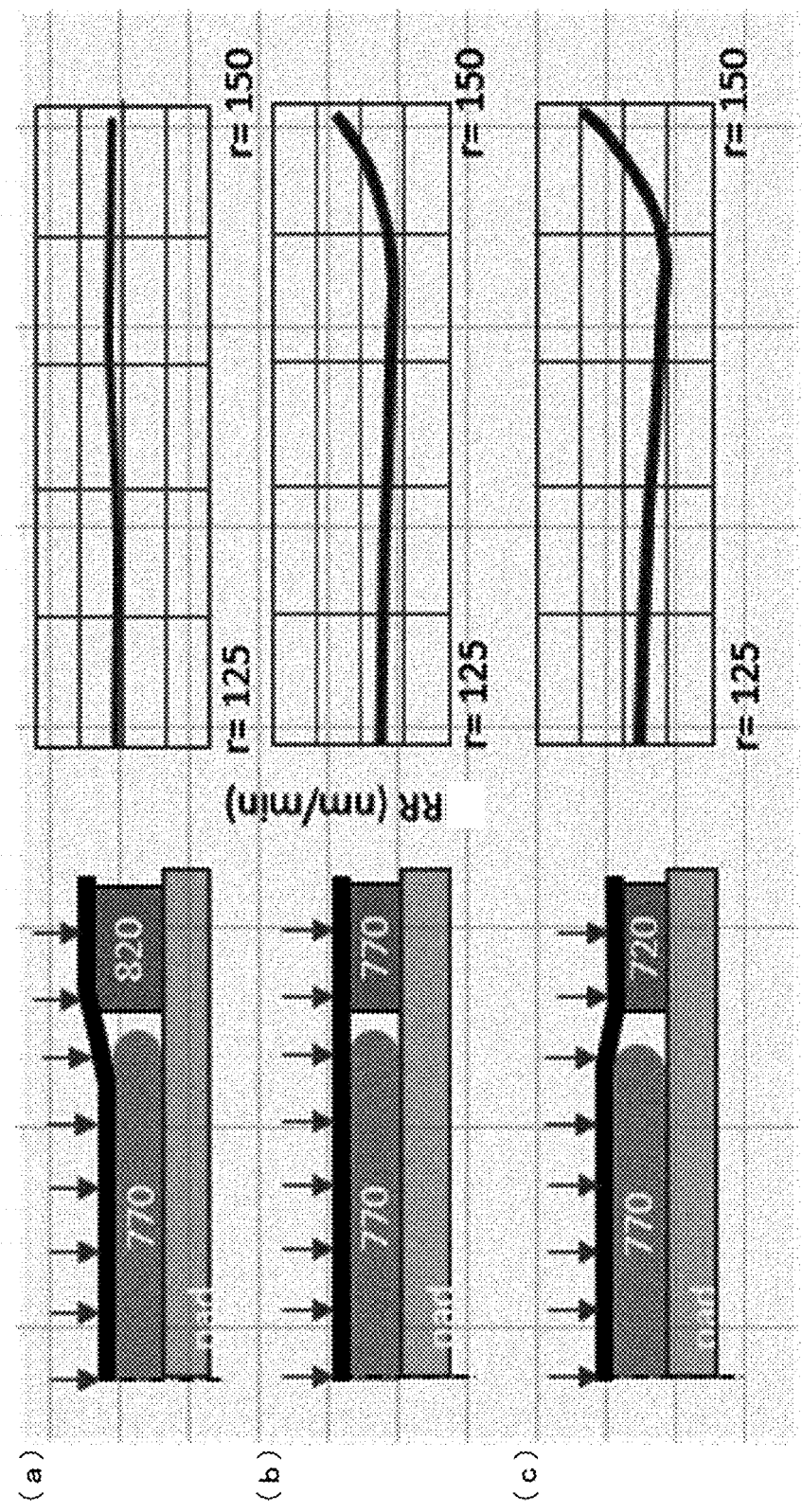
FIGS. 14(a), 14(b) and 14(c) are diagrams for illustrating a removal rate RR model with a conventional template, FIG. 15 (a) and 15 (b) are diagrams for illustrating a removal rate RR model with a template that provide a pressurized area diameter<a wafer diameter according to Patent Literature 1.
Figure 15:
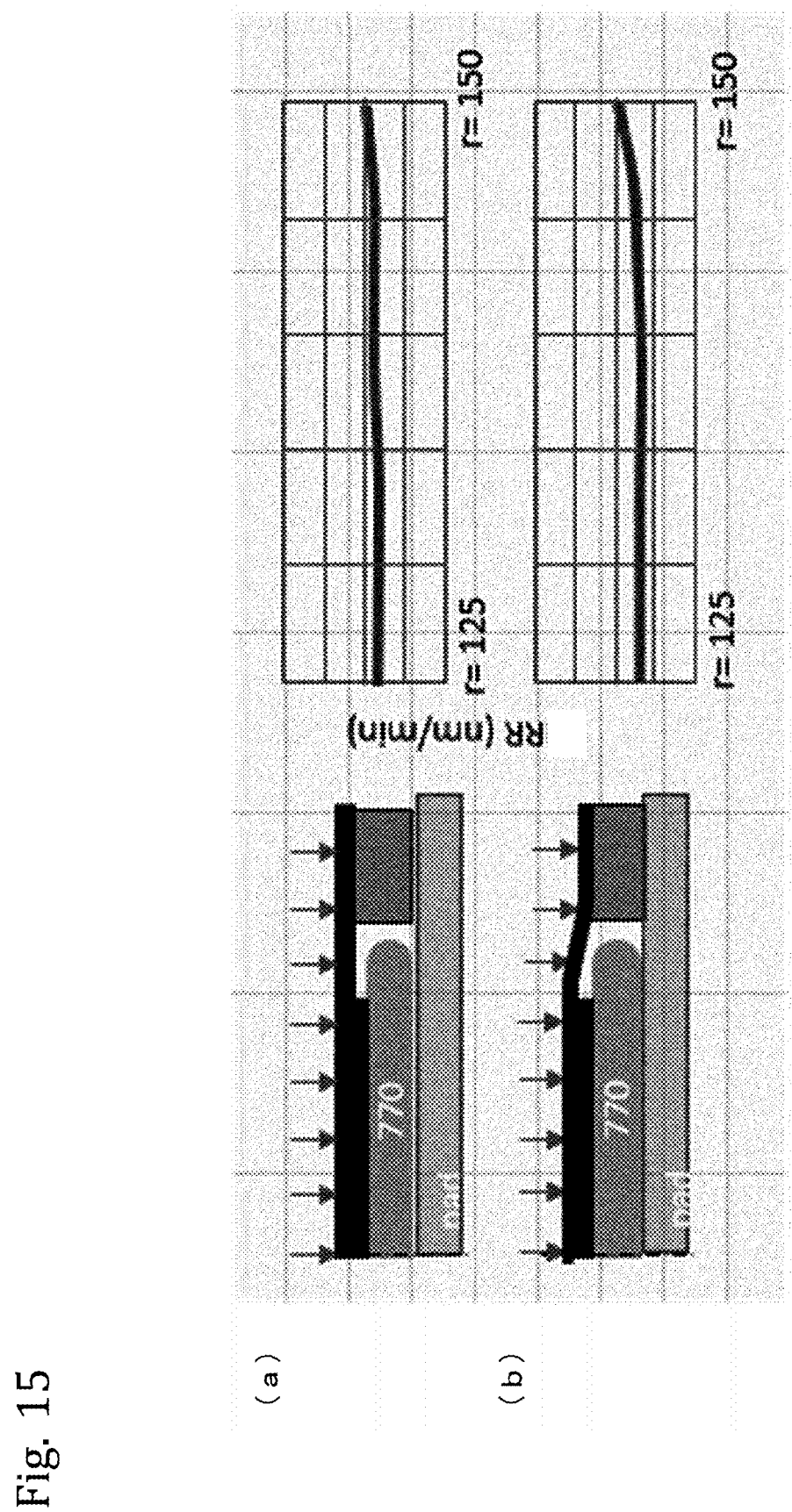

FIG. 13 are schematic diagrams for illustrating the first step and the second step in the processing of step S108 shown in FIG. 12.

FIGS. 13(*a*) and 13(*b*) show the first step, and FIGS. 13(*c*) and 13(*d*) show the second step. As indicated by the arrows in these drawings, the first step and the second step proceeds from (a) to (b), from (b) to (c), and from (c) to (d) as a series of steps.

In the first step, the treatment is performed by applying the processing pressure P1 to the back side of the wafer W opposite to the polished surface, applying the pressure P2 to the polishing pad 50, and the membrane support ring 3 is raised, thereby adjusting the pressurized area P1' so that the processing pressure on the back-side circumference of the wafer W opposite to the polished surface is smaller than the processing pressure P1. The air bag P4 is in the non-pressure in which no pressure fluid is supplied.

In the processing of the first step, as the pressurized area decreases as shown in FIG. 13(*a*), an edge part swelling phenomenon occurs as shown in FIG. 13(*b*).

In the second step, the treatment is performed by stopping the application of the processing pressure P1, applying the pressure P2 to the polishing pad 50, and lowering the membrane support ring 3, thereby releasing the processing pressure-reduced state (the state of the pressurized area P1') at the back-side circumference of the wafer W opposite to the polished surface, and by applying the compensating pressure P4 in the compensating pressure pattern according to the operating condition to the back-side outer circumference vicinity (near-edge region) of the wafer W opposite to the polished surface.

In the processing of the second step, as shown in FIG. 13(*c*), partial corrective pressurization is performed with the compensating pressure P4 in the compensating pressure pattern according to the operating condition. After that, the pressure P2 on the polishing pad 50 is released (FIG. 13(*d*), and the second step ends.

The polishing head 100 and the polishing treatment device S with the polishing head 100 according to this embodiment can steadily perform a polishing treatment with high quality by adjusting and controlling the processing pressure P1, the pressurized area P1', the pressure P2, and the compensating pressure P4. In addition, uneven polishing, such as partial insufficient polishing or over-polishing, of the polished surface of the substrate can be prevented, and ESFQR or the like of the substrate surface can be further improved.

Furthermore, the polishing head 100 and the polishing treatment device S with the polishing head 100 according to this embodiment can provide a mechanism that sets a non-pressure region at a wafer edge part to reduce the increase of the edge part surface pressure during the entire area pressurization and applies a compensating pressure to an uneven surface pressure part to attain a proper balance of surface pressure at the wafer edge part.

[Variation]

In the following, a variation of the polishing head will be described. The same components as those of the polishing head 100 and the polishing treatment device S having the polishing head 100 described in the example embodiment are denoted by the same reference numerals, and descriptions thereof will be omitted.

Figure 17:
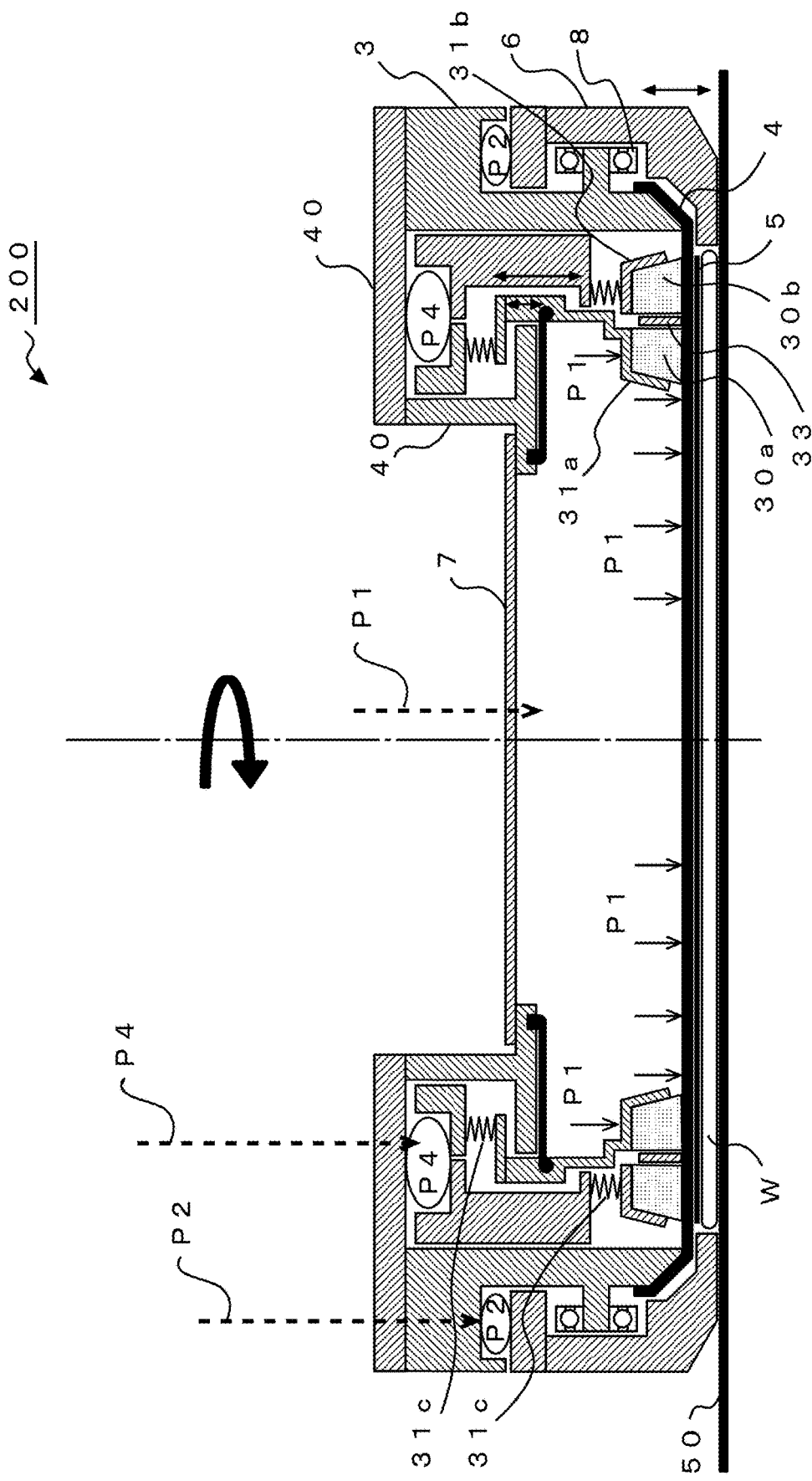
FIG. 17 is a schematic vertical cross-sectional view for illustrating an example of a polishing head of a polishing treatment device and a peripheral arrangement thereof according to a variation.

FIG. 17 is a schematic vertical cross-sectional view for illustrating an example of a polishing head 200 of the polishing treatment device S according to a variation and a peripheral arrangement thereof. An example of a configuration of the polishing head 200 will be described with reference to FIG. 17.

In the description below, in order to further improve the global backside ideal range (GBIR) or the like of the wafer surface, the wafer W is held with the polished surface thereof in sliding contact with the polishing pad 50 under the pressure controlled by the polishing treatment device S, and the pressure is applied to the held wafer W in a direction toward the polishing pad 50 from the back (back side) of the wafer W opposite to the polished surface.

[Configuration of Polishing Head]

Generally speaking, the polishing head 200 shown in FIG. 17 has a holding mechanism that brings the wafer W to be polished into sliding contact with the polishing pad 50 in a state where a polishing pressure (processing pressure) is applied to the wafer W, for example. The polishing head 200 also has a pressing mechanism that applies the polishing pressure (processing pressure) to the wafer W or presses the retainer ring 6 against the polishing pad 50.

The polishing head 200 includes a head housing 40, the membrane support ring 3, the membrane 4, the backing film 5, the retainer ring 6, and the flexible plate 7.

The polishing head 200 is configured so that a driving force (such as a rotational force (torque) from the motor, which is actuation means) is transmitted thereto via the flexible plate 7 connected to the head housing 40. Specifically, the membrane support ring 3 is connected to the flexible plate 7 connected to the head housing 40 (the connections are not shown), and the retainer ring 6 is connected to the membrane support ring 3 via the drive pin 8.

Thus, the components of the polishing head 200 can integrally horizontally rotate or stop rotating. The flexible plate 7 serves as driving means that integrally horizontally rotates the membrane support ring 3 and the retainer ring 6.

The start and stop of the rotation, the number of revolutions per unit time and the like are controlled by the control unit 20 based on specifications previously set.

The membrane support ring 3 is an annular body sized to have an inner diameter enough to surround the outer circumference of the substrate (wafer W) to be polished. The membrane support ring 3 is connected to the head housing 40. The membrane support ring 3 is made of SUS material, for example.

The membrane 4 covers a lower end-side opening part of the membrane support ring 3 and holds the wafer W with the backing film 5 pasted to a front surface of the membrane 4 interposed therebetween.

The membrane 4 is an elastic body of a cylindrical shape (cylindrical elastic body) formed in a substantially cylindrical (pan-like) shape having an inner diameter that allows the membrane 4 to be fitted around the outer circumferential surface of the membrane support ring 3. The membrane 4 is made of a rubber material having high strength and durability, such as ethylene propylene rubber (EPDM) or silicone rubber.

The backing film 5 is a thin film stretched on an outer bottom surface (outer surface) of the membrane 4. The backing film 5 may be made of a porous material, such as nonwoven fabric. The backing film 5 makes the polished surface of the wafer W face (abut against) the polishing pad 50 and holds the wafer W in sliding contact with the polishing pad 50. In this way, the membrane 4 and the backing film 5 serve as the holding mechanism that holds the wafer W.

The retainer ring 6 is shaped to surround the outer circumference of the wafer W. Not only does the retainer ring 6 prevent the wafer W energized by the rotational force of the polishing head 200 and the polishing table 51 from flying out in the radial direction, the retainer ring 6 is involved with controlling the contact pressure between the wafer edge part and the polishing pad 50.

A gel-body ring 30a (first annular elastic body 30a) and a gel-body ring 30b (second annular elastic body 30b) are arranged on the back surface of the membrane 4 of the polishing head 200.

Furthermore, a first corrective pressing ring 31a that applies a pressure to the upper surface of the first annular elastic body 30a and a second corrective pressing ring 31b that applies a pressure to the upper surface of the second annular elastic body 30b are arranged inside the membrane support ring 3 (annular body 3).

As shown in FIG. 17, the polishing head 200 is configured so that a pressure fluid (such as compressed air) can be supplied to or collected from the air bag P4 through an air pipe coupled to the fluid supply mechanism (not shown).

That is, the polishing head 200 is configured so that the amount of the pressure fluid supplied to the air bag P4 (as indicated by the dashed line P4 in FIG. 17) can be adjusted to raise or lower the first and second corrective pressing rings.

The polishing head 200 shown in FIG. 17 is configured so that the operation of raising and lowering the first and second corrective pressing rings is achieved with a spring 31c. In the following, configurations of the gel-body rings and the corrective pressing rings will be described in detail.

Figure 18:
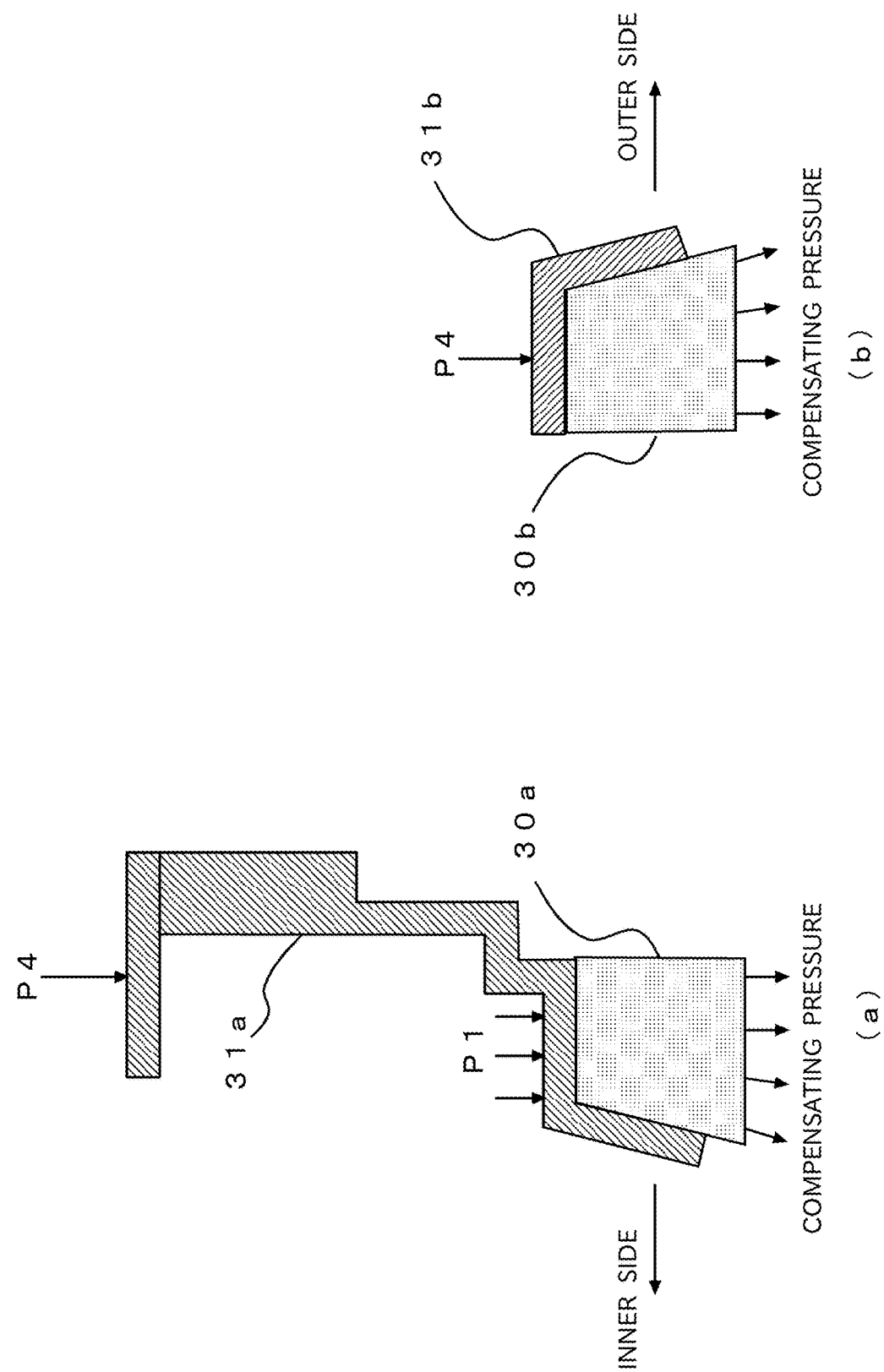
FIG. 18 are schematic vertical cross-sectional views showing an example of cross-sectional shapes of first and second annular elastic bodies.

FIG. 18 are schematic vertical cross-sectional views showing an example of the cross-sectional shapes of the first and second annular elastic bodies.

Figure 19:
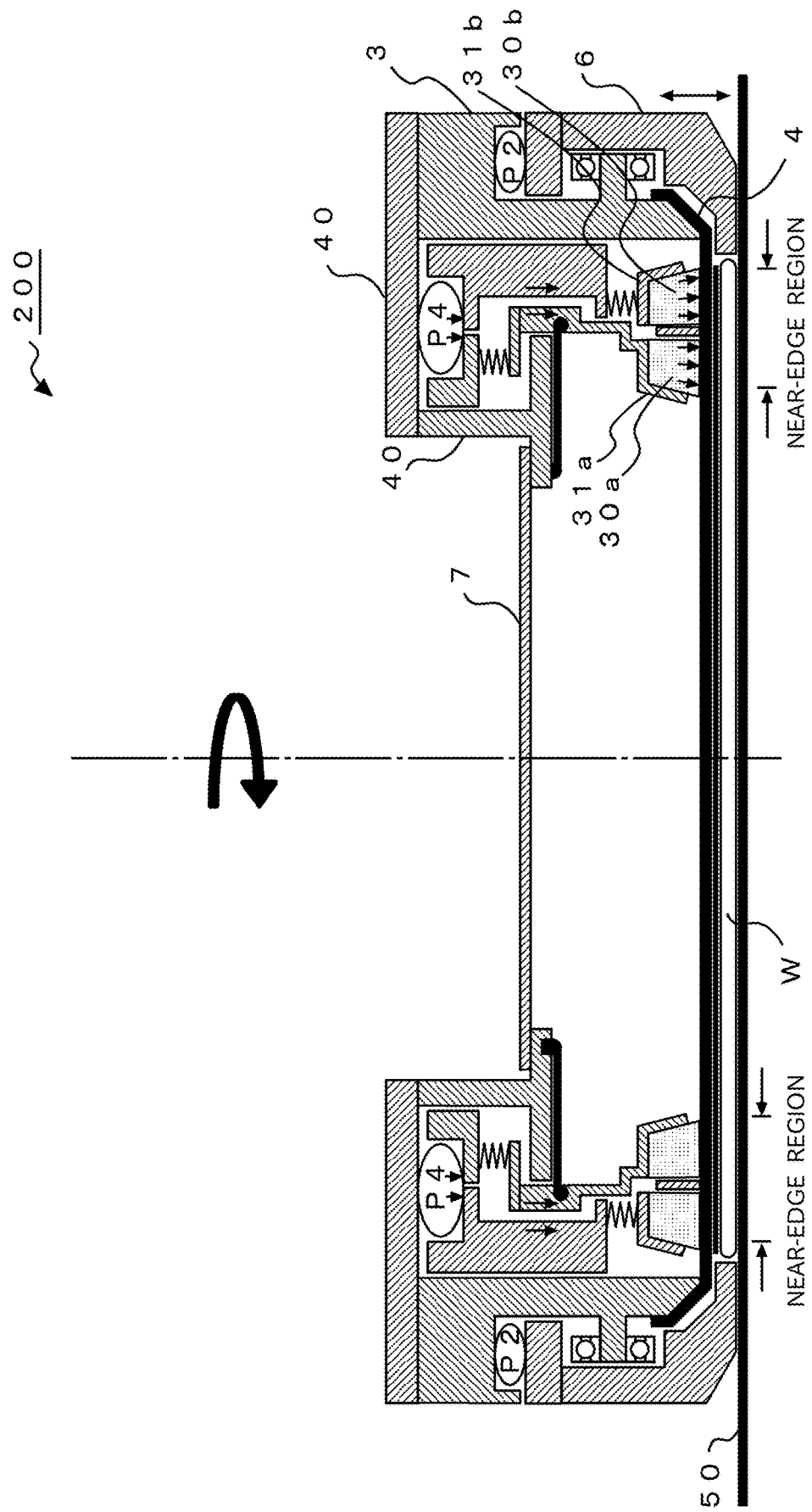
FIG. 19 is a schematic vertical cross-sectional view for illustrating operations of first and second corrective pressing rings.

FIG. 19 is a schematic vertical cross-sectional view for illustrating operations of the first and second corrective pressing rings.

As described above, the annular elastic body of the polishing head 20 is divided into the first annular elastic body 30a on the inner side and the second annular elastic body 30b on the outer side as shown in FIG. 17.

Furthermore, the polishing head 200 has the first corrective pressing ring 31a that applies a pressure to the first annular elastic body 30a and the second corrective pressing ring 31b that applies a pressure to the second annular elastic body 30b.

Therefore, as shown in FIG. 19, the compensating pressure applied to the back-side outer circumference vicinity (near-edge region) of the wafer opposite to the polished surface is partially applied by the first annular elastic body 30a on the inner side and partially applied by the second annular elastic body 30b on the outer side.

Furthermore, a deformation prevention ring 33 is arranged between the first annular elastic body 30a and the second annular elastic body 30b to reduce the interaction between the deformation of the first annular elastic body 30a and the deformation of the second annular elastic body 30b during application of the compensating pressure.

In the above example embodiment (polishing head 100), the annular elastic body 10 has been described as being arranged with the centerline of the bottom surface thereof aligned with the boundary between the pressurized circumferential band and the non-pressurized circumferential band of the membrane 4 and the wafer W (see FIG. 11, for example). With the polishing head 200 according to this variation, the deformation prevention ring 33 is arranged at the boundary position. In this way, the principle and mechanism of ESFQR ≈0, which cannot be elucidated with the conventional polishing heads, can be elucidated, and GBIR can also be dramatically improved.

As shown in FIG. 18(a), the first annular elastic body 30a is formed in a trapezoidal shape with the inner side surface being an inclined surface.

The second annular elastic body 31b is formed in a trapezoidal shape with the outer side surface being an inclined surface. The second annular elastic body 31b has a smaller size than the wafer W.

As shown in FIG. 18(a), the first corrective pressing ring 31a is configured to cover all or part of the inclined surface (inner side surface) of the first annular elastic body 30a.

The second corrective pressing ring 31b is configured to cover all or part of the inclined surface (outer side surface) of the second annular elastic body 30b (FIG. 18(b)). In this way, the loss of the compensating pressure due to the deformation of the first annular elastic body 30a and the deformation of the second annular elastic body 30b during application of the compensating pressure can be reduced. That is, the adjustment of the compensating pressure by pressure application by the fourth pressure adjusting means can be facilitated, and the compensating pressure can be more appropriately applied to the back-side outer circumference vicinity (near-edge region) of the wafer W opposite to the polished surface.

Furthermore, as shown in FIG. 18(a), the first corrective pressing ring 31a is configured to cover the upper surface of the first annular elastic body 30a to apply thereto the pressure from the fourth pressure adjusting means, and is configured so that the processing pressure P1 applied to the back side of the wafer opposite to the polished surface by adjusting the pressure in the space defined by the head housing 40, the first corrective pressing ring 31a and the elastic body (membrane 4) is also applied to the upper surface of the first annular elastic body 30a. In this way, since the first corrective pressing ring 31a covers the upper surface of the first annular elastic body 30a, the first corrective pressing ring 30a can apply the processing pressure P1 to the back side of the wafer W opposite to the polished surface via the bottom surface of the first annular elastic body 30a.

In the pressure adjustment processing (step S108) in which the compensating pressure P4 in the compensating pressure pattern according to the operating condition is applied to the back-side outer circumference vicinity (near-edge region) of the wafer W opposite to the polished surface, the first annular elastic body 30a and the second annular elastic body 30b facilitate the adjustment of the compensating pressure at a vicinity region of the deformation prevention ring 33 (see FIG. 19).

The embodiment described above is intended to specifically describe the present invention, and the scope of the present invention is not limited to the embodiment.

REFERENCE SIGNS LIST 2, 40 head housing
3 membrane support ring
4 membrane
5 backing film
6 retainer ring
7 flexible plate
20 control unit
50 polishing pad
51 polishing table
100, 200 polishing head
S polishing treatment device
N nozzle
W wafer

The invention claimed is:

1. A polishing treatment device, comprising:
a polishing table having a polishing pad;
a polishing head that holds a substrate to be polished and brings a polished surface of the substrate into sliding contact with the polishing pad; and
a processor that controls the polishing head, wherein
the polishing head comprises:
  a head housing that has
    a first flange part that extends outward from an upper position of a circumferential surface of a cylindrical body and
    a second flange part that extends outward from a lower position of the circumferential surface;
  an annular body that is sized to surround an outer circumference of the second flange part and has a third flange part that is formed at an upper end part thereof and located between the first flange part and the second flange part;
  an elastic body that covers a lower end-side opening part of the annular body and holds the substrate with a backing film pasted to a front surface thereof interposed therebetween;
  a retainer ring formed in a shape to surround an outer circumference of the substrate;
  driving means that integrally horizontally rotates the head housing, the annular body, and the retainer ring;
  an annular elastic body being arranged on a back surface of the elastic body; and
  a corrective pressing ring that applies a pressure to an upper surface of the annular elastic body being arranged inside the annular body,
the polishing head further comprises:
  first pressure adjusting means that adjusts a processing pressure applied to a back side of the substrate opposite to the polished surface by adjusting a pressure in a space surrounded by the head housing, the annular body, and the elastic body;
  second pressure adjusting means that adjusts a pressure applied to the polishing pad by the retainer ring by means of the first flange part;
  third pressure adjusting means that adjusts, by means of the second flange part, a processing pressure applied to a back-side circumference of the substrate opposite to the polished surface by raising or lowering the annular body via the third flange part; and
  fourth pressure adjusting means that adjusts, by means of the second flange part, a compensating pressure applied to a back-side outer circumference vicinity of the substrate opposite to the polished surface by the corrective pressing ring via the annular elastic body, and
as a first step, the processor
  controls the first pressure adjusting means to apply the processing pressure to the back side of the substrate opposite to the polished surface,
  controls the second pressure adjusting means to apply the pressure to the polishing pad, and
  controls the third pressure adjusting means to raise the annular body to reduce the processing pressure on the back-side circumference of the substrate opposite to the polished surface compared with the processing pressure applied by the first pressure adjusting means, and
as a second step, the processor
  controls the first pressure adjusting means to stop applying the processing pressure,
  controls the second pressure adjusting means to apply the pressure to the polishing pad,
  controls the third pressure adjusting means to lower the annular body to stop reducing the processing pressure on the back-side circumference of the substrate opposite to the polished surface, and
  controls the fourth pressure adjusting means to apply the compensating pressure to the back-side outer circumference vicinity of the substrate opposite to the polished surface.

2. The polishing treatment device according to claim 1, wherein
the second pressure adjusting means adjusts the pressure applied to the polishing pad by the retainer ring by adjusting a pressure fluid flowed into an air bag arranged between the first flange part and the retainer ring under the control of the processor.

3. The polishing treatment device according to claim 1, wherein
the third pressure adjusting means adjusts a pressurized area in which the processing pressure is applied to the back-side circumference of the substrate opposite to the polished surface by raising or lowering the annular body by adjusting a pressure fluid flowed into an air bag arranged between the second flange part and the third flange part under the control of the processor.

4. The polishing treatment device according to claim 1, wherein
the fourth pressure adjusting means adjusts the compensating pressure applied to the back-side outer circumference vicinity of the substrate opposite to the polished surface by the annular elastic body by adjusting a pressure fluid flowed into an air bag arranged between the third flange part and the corrective pressing ring under the control of the processor.

5. The polishing treatment device according to claim 1, further comprising:
restraining means that restrain the raising of the annular body by the third pressure adjusting means within a predetermined range.

6. The polishing treatment device according to claim 1, wherein
the annular elastic body is formed to have a smaller size than the substrate.

7. The polishing treatment device according to claim 1, wherein
the annular body is connected to a flexible plate connected to the head housing, and the retainer ring is connected to the annular body by a drive pin.

8. A polishing head that is provided in a polishing treatment device having a polishing pad that rotates horizontally, holds a substrate to be polished, and brings a polished surface of the substrate into sliding contact with the polishing pad, comprising:
a head housing that has
a first flange part that extends outward from an upper position of a circumferential surface of a cylindrical body and
a second flange part that extends outward from a lower position of the circumferential surface;
an annular body that is sized to surround an outer circumference of the second flange part and has a third flange part that is formed at an upper end part thereof and located between the first flange part and the second flange part;
an elastic body that covers a lower end-side opening part of the annular body and holds the substrate with a backing film pasted to a front surface thereof interposed therebetween;
a retainer ring formed in a shape to surround an outer circumference of the substrate;
driving means that integrally horizontally rotates the head housing, the annular body, and the retainer ring;
an annular elastic body being arranged on a back surface of the elastic body;
and a corrective pressing ring that applies a pressure to an upper surface of the annular elastic body being arranged inside the annular body,
the polishing head further comprising:
first pressure adjusting means that adjusts a processing pressure applied to a back side of the substrate opposite to the polished surface by adjusting a pressure in a space surrounded by the head housing, the annular body, and the elastic body;
second pressure adjusting means that adjusts a pressure applied to the polishing pad by the retainer ring by means of the first flange part;
third pressure adjusting means that adjusts, by means of the second flange part, a pressurized area in which the processing pressure is applied to a back-side circumference of the substrate opposite to the polished surface by raising or lowering the annular body via the third flange part; and
fourth pressure adjusting means that adjusts, by means of the second flange, a compensating pressure applied to a back-side outer circumference vicinity of the substrate opposite to the polished surface by the corrective pressing ring via the annular elastic body;
wherein as a first step,
the first pressure adjusting means applies the processing pressure to the back side of the substrate opposite to the polished surface,
the second pressure adjusting means applies the pressure to the polishing pad, and
the third pressure adjusting means raises the annular body to reduce the processing pressure on the back-side circumference of the substrate opposite to the polished surface compared with the processing pressure applied by the first pressure adjusting means, and
as a second step,
the first pressure adjusting means stops applying the processing pressure,
the second pressure adjusting means applies the pressure to the polishing pad,
the third pressure adjusting means lowers the annular body to stop reducing the processing pressure on the back-side circumference of the substrate opposite to the polished surface, and
the fourth pressure adjusting means applies the compensating pressure to the back-side outer circumference vicinity of the substrate opposite to the polished surface.

9. A polishing treatment method by a polishing head that is provided in a polishing treatment device having a polishing pad that rotates horizontally, holds a substrate to be polished, and brings a polished surface of the substrate into sliding contact with the polishing pad,
wherein the polishing head comprises:
a head housing that has
a first flange part that extends outward from an upper position of a circumferential surface of a cylindrical body and
a second flange part that extends outward from a lower position of the circumferential surface;
an annular body that is sized to surround an outer circumference of the second flange part and has a third flange part that is formed at an upper end part thereof and located between the first flange part and the second flange part;
an elastic body that covers a lower end-side opening part of the annular body and holds the substrate with a backing film pasted to a front surface thereof interposed therebetween;
a retainer ring formed in a shape to surround an outer circumference of the substrate;
driving means that integrally horizontally rotates the head housing, the annular body, and the retainer ring;

an annular elastic body being arranged on a back surface of the elastic body; and a corrective pressing ring that applies a pressure to an upper surface of the annular elastic body being arranged inside the annular body, the polishing head further comprises:

first pressure adjusting means that adjusts a processing pressure applied to a back side of the substrate opposite to the polished surface by adjusting a pressure in a space surrounded by the head housing, the annular body, and the elastic body;

second pressure adjusting means that adjusts a pressure applied to the polishing pad by the retainer ring by means of the first flange part;

third pressure adjusting means that adjusts, by means of the second flange part, a pressurized area in which the processing pressure is applied to a back-side circumference of the substrate opposite to the polished surface by raising or lowering the annular body via the third flange part; and fourth pressure adjusting means that adjusts, by means of the second flange part, a compensating pressure applied to a back-side outer circumference vicinity of the substrate opposite to the polished surface by the corrective pressing ring via the annular elastic body, and the polishing treatment method comprises:

a first step for controlling, by a processor, the first pressure adjusting means to apply the processing pressure to the back side of the substrate opposite to the polished surface, the second pressure adjusting means to apply the pressure to the polishing pad, and the third pressure adjusting means to raise the annular body to reduce the processing pressure on the back-side circumference of the substrate opposite to the polished surface compared with the processing pressure applied by the first pressure adjusting means; and a second step for controlling, by the processor, the first pressure adjusting means to stop applying the processing pressure, the second pressure adjusting means to apply the pressure to the polishing pad, the third pressure adjusting means to lower the annular body to stop reducing the processing pressure on the back-side circumference of the substrate opposite to the polished surface, and the fourth pressure adjusting means to apply the compensating pressure to the back-side outer circumference vicinity of the substrate opposite to the polished surface.

* * * * *